US009922695B2

(12) United States Patent
Tomishima et al.

(10) Patent No.: US 9,922,695 B2
(45) Date of Patent: Mar. 20, 2018

(54) APPARATUS AND METHOD FOR PAGE COPYING WITHIN SECTIONS OF A MEMORY

(71) Applicant: Intel Corporation, Santa Clara, CA (US)

(72) Inventors: Shigeki Tomishima, Portland, OR (US); Shih-Lien L. Lu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/668,895

(22) Filed: Mar. 25, 2015

(65) Prior Publication Data

US 2016/0284390 A1     Sep. 29, 2016

(51) Int. Cl.
*G11C 11/40*     (2006.01)
*G11C 5/02*      (2006.01)
(Continued)

(52) U.S. Cl.
CPC .......... *G11C 11/4091* (2013.01); *G11C 5/025* (2013.01); *G11C 7/08* (2013.01); *G11C 7/1006* (2013.01); *G11C 7/1045* (2013.01); *G11C 7/20* (2013.01); *G11C 7/22* (2013.01); *G11C 11/4072* (2013.01); *G11C 11/4076* (2013.01); *G11C 11/4093* (2013.01); *G11C 11/4096* (2013.01);
(Continued)

(58) Field of Classification Search
CPC ............ G11C 11/4091; G11C 11/4093; G11C 11/4096; G11C 5/025; G11C 7/1045; G11C 7/1006; G11C 7/08; G11C 7/20; G11C 7/22; G11C 11/4072; G11C 11/4076; G11C 2207/005; G11C 2207/105; G11C 2207/107

See application file for complete search history.

(56) References Cited

U.S. PATENT DOCUMENTS 5,381,368 A    1/1995 Morgan et al.
5,440,517 A    8/1995 Morgan et al.
(Continued)

OTHER PUBLICATIONS

Vivek Seshadri et al., "RowClone: Fast and Energy-Efficient In-DRAM Bulk Data Copy and Initialization", MICRO-46 Proceeding of the 46th Institute of Electrical and Electronics Engineers Annual Association for Computing Machinery (ACM) IEEE/ACM International Symposium Microarchitecture, pp. 185-187 (Published Dec. 7, 2013).

(Continued)

*Primary Examiner* — J. H. Hur
(74) *Attorney, Agent, or Firm* — Compass IP Law PC

(57) ABSTRACT

An apparatus comprises: a source array of memory cells with associated source sense amplifiers; a destination array of memory cells with associated destination sense amplifiers; and logic to activate a source word-line (WL) to select a row of memory cells within the source array such that data in the selected row of memory cells is latched by the associated source sense amplifiers, wherein the logic to activate a destination WL to select a row of memory cells within the destination array such that data in the selected row of memory cells is latched by the associated destination sense amplifiers, and wherein the source and destination arrays of memory cells are within a same bank of a memory.

20 Claims, 18 Drawing Sheets

(51) Int. Cl.
    *G11C 7/08*      (2006.01)
    *G11C 7/10*      (2006.01)
    *G11C 7/22*      (2006.01)
    *G11C 7/20*      (2006.01)
    *G11C 11/4091*   (2006.01)
    *G11C 11/4093*   (2006.01)
    *G11C 11/4096*   (2006.01)
    *G11C 11/4072*   (2006.01)
    *G11C 11/4076*   (2006.01)

(52) U.S. Cl.
    CPC .. *G11C 2207/005* (2013.01); *G11C 2207/105* (2013.01); *G11C 2207/107* (2013.01)

(56) References Cited

U.S. PATENT DOCUMENTS

| | | | |
|---|---|---|---|
| 5,625,601 | A | 4/1997 | Gillingham et al. |
| 5,854,771 | A | 12/1998 | Mori |
| 5,886,944 | A | 3/1999 | Anh |
| 6,289,413 | B1 | 9/2001 | Rogers et al. |
| 6,449,204 | B1 * | 9/2002 | Arimoto ............ G11C 7/1045 365/189.09 |
| 2001/0008498 | A1 * | 7/2001 | Ooishi ............ G11C 7/10 365/230.03 |
| 2003/0103368 | A1 * | 6/2003 | Arimoto ............ G11C 7/1045 365/63 |
| 2006/0233013 | A1 | 10/2006 | Tu et al. |
| 2010/0149894 | A1 * | 6/2010 | Mochida ............ G11C 11/4076 365/200 |
| 2010/0157693 | A1 * | 6/2010 | Iwai ............ G11C 5/143 365/189.09 |
| 2014/0059285 | A1 | 2/2014 | Kim et al. |
| 2014/0173234 | A1 | 6/2014 | Jung et al. |
| 2014/0177347 | A1 | 6/2014 | Chatterjee et al. |

OTHER PUBLICATIONS

International Search Report and Written Opinion for PCT Application No. PCT/US16/17226 dated Jun. 3, 2016, 12 pages.
Office Action and Search Report for Taiwan Patent Application No. 105101888 dated Feb. 20, 2017, 8 pages.
English Translation of Search Report of R.O.C. Patent Application No. 10501888, dated Oct. 5, 2017, 1 page.

* cited by examiner

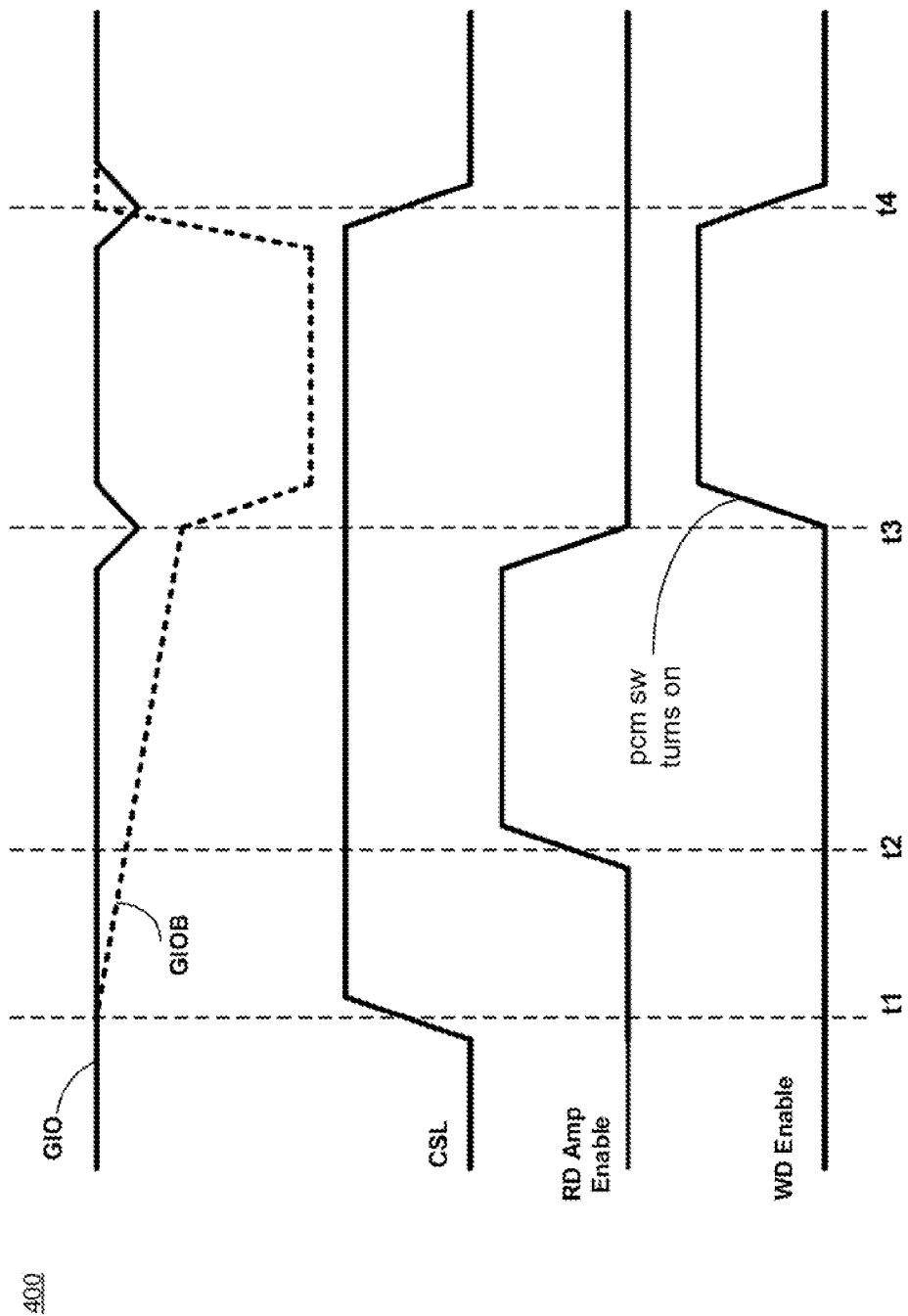

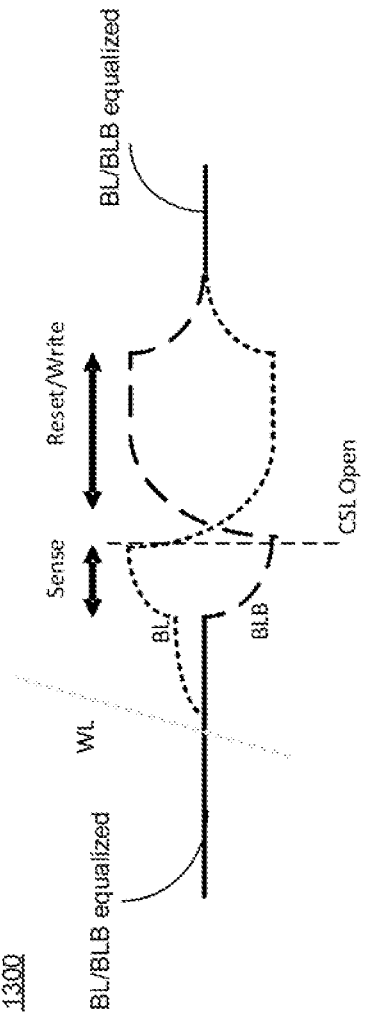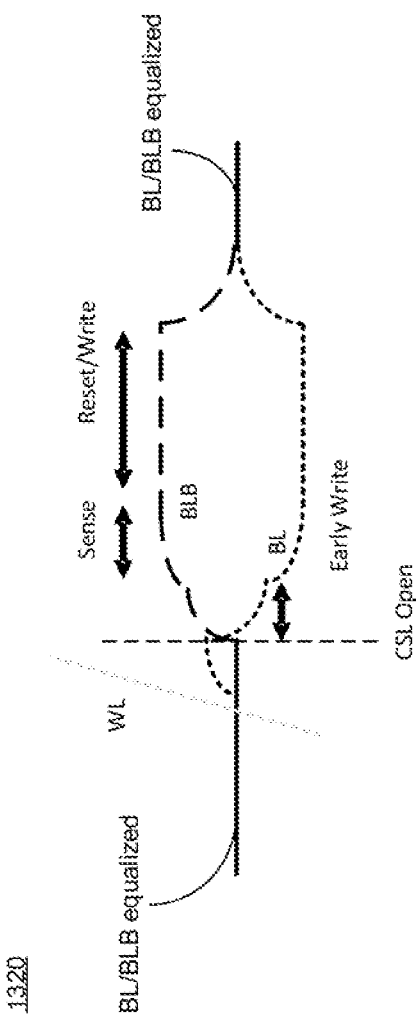

APPARATUS AND METHOD FOR PAGE COPYING WITHIN SECTIONS OF A MEMORY

BACKGROUND

A computer system spends a significant portion of its time performing bulk data operations. Bulk data operations degrade both system performance and energy efficiency because bulk data operations use high number of transfers over a memory channel which couples a memory chip with a memory controller. For example, a typical memory system today (e.g., using Double Data Rate 3 (DDR3)-1066) takes roughly a microsecond (i.e., 1046 nanoseconds) to copy 4 Kilo Bytes (KB) of data by transferring that data over a memory channel. One microsecond of latency, in today's high speed memories, is high latency which degrades performance of the computing system. Such high latency can degrade performance of concurrently-running applications that share the bandwidth of the memory channel.

Another type of data operation that may cause high latency (i.e., increase in the number of data transfers over the memory channel) is presetting or resetting contents of a block of memory. Presetting/resetting operations are typically used in graphics or display applications where such applications desire to clear or wipe the output of some or all of the display contents (e.g., to make some portion of the image display black or white completely). One way to zero the contents of a block of memory (i.e., to reset the memory) is to write zero to the block of memory by transferring data indicating zero over the memory channel. Such a method of resetting the block of memory uses a large number of data transfers over the memory channel.

Another way to zero the contents of a block of memory is to use high-level software programming functions such as "Memset(ptr, 0, nbyte)" and "calloc( )". These software functions are usually implemented as programming loops of store instructions. Store or write instructions cause high data transfers over the memory channel. With Advanced Vector Instructions (AVX), it is possible to clear or set 256 bytes at a time using a single instruction. However, to clear a whole page (e.g., 4 KB), the AVX instructions need to loop through 128 times, which is both time and power consuming.

Another example of a data operation that may cause high latency (i.e., increase in the number of data transfers over the memory channel) is inverting or complementing a large amount of raw data in a block of memory. The process of inverting or complementing a large amount of raw data is typically used in image processing where it is often desired to get a negative of an image. One way to invert or complement a large amount of raw data is to transfer the inverted or complemented data over the memory channel to the memory chip, and then writing that inverted or complemented data to the block of memory.

One such image processing operation is performed by a digital camera. In this case, the digital camera creates the image, stores the image in raw format, and creates the negative image for further image processing. When creating the negative image, the particular hardware (in this example, the digital camera) must go through the steps of reading the data word by word, complementing the word, and then storing the inversed word back in the image format. It takes both time and power or go through the image one word at a time.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 4 illustrates a plot showing a timing diagram of various control signals for page copy within different sections of a bank of memory with CSLs extending in the same direction as the GIO lines, according to some embodiments of the disclosure.

FIGS. 13A-B illustrate plots showing timing diagrams for resetting or presetting a page (i.e., rows of memory cells) in a section of the memory, according to some embodiments of the disclosure.

DETAILED DESCRIPTION

Figure 1:
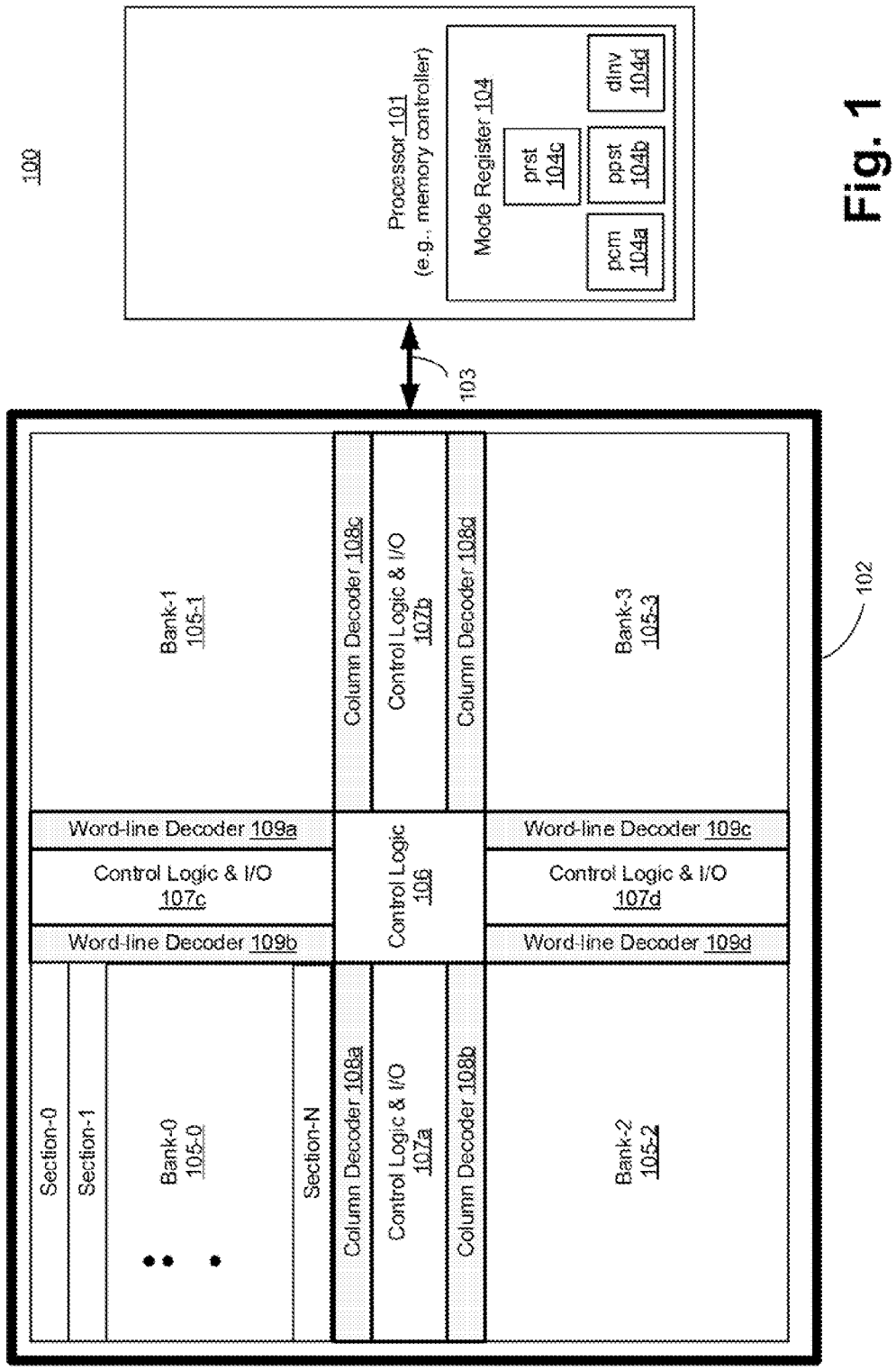
FIG. 1 illustrates an architecture with an apparatus for page copying within different sections of a memory, for resetting the memory, for pre-setting the memory, and/or for inverting data from the memory, according to some embodiments of the disclosure.

Data copy between banks within a memory device has been proposed by strictly imposing data locality to store data in the same section of the bank. One way to copy data within the same section of a memory bank is Fast Parallel Mode (FPM). In FPM, data locality is strictly imposed in order to keep the data in the same section of the bank. FPM is not extendable for copying data between multiple sections of the same memory bank. Another scheme for copying data is Pipelined Serial Mode (PSM). In PSM, page data is copied only between banks, which takes a long time and is not energy efficient. PSM does not address the problem of copying data between different sections of the same memory bank.

Some embodiments use an existing memory (e.g., Dynamic Random Access Memory (DRAM)) chip interface, internal mechanism, and circuits to implement a page data copy function inside the memory chip. For example, data transfer over a memory bus coupling the DRAM chip interface is largely kept inactive during the internal page copy operation. In some embodiments, instead of external READ and WRITE operations with a lot of data transactions between a processor (e.g., a memory controller) and the memory chip, a copy function is provided on the memory chip via a small number of additional pins and/or commands. In some embodiments, the additional pin is a dedicated pin for requesting or initiating the page copy operation. In some embodiments, existing command pins are multiplexed for commanding the page copy operation without the addition of additional pins. In some embodiments, the processor sends a page copy command to the memory integrated circuit (IC) and, internally, the memory IC can handle the copy operation. In some embodiments, the internal copy operation uses the internal input-output (IO) bus lines on the memory array.

There are many technical effects of various embodiments. One technical effect is that page copy can be performed by transmitting a single command to the memory device without external data transactions, which leads to lower energy consumption and shorter copy period. As such, page copy can be performed in a shorter time than known methods and in an energy efficient manner. The memory architecture of some embodiments has a much wider address flexibility than FPM and much shorter operation time and higher energy efficiency than PSM.

In some embodiments, internal mechanism and circuits are provided to clear (i.e., reset to logic low) or set (e.g., set to logic high) a complete row of memory cells in a section of a bank. In some embodiments, instead of impacting the subarray architecture and layouts, the existing write command is used to clear/set a whole row of memory cells by activating multiple column select line (CLSs). One technical effect of some embodiments is that a row of memory cells can be clear/set in a simpler and faster manner that saves power.

Various embodiments allow users to specify a range of the memory to be complemented such that the complement operation is performed within the memory device in response to receiving a command from the memory controller to perform the operation. In some embodiments, a data inversion mechanism is provided to swap and output Data_Bar or Data_True before the output buffers, where Data_Bar is inverse of Data and Data_True is the non-inverted data. In some embodiments, this swapping operation is performed using the exiting memory internal IO bus architecture and an additional row address compare circuit. In some embodiments, when the Row Address Compare Circuits detect a match between an input address and a registered address (which is the address of a row of memory cells whose data is desired to be swapped), the processor sends a swap enable signal to pre-latch circuits, positioned before the output buffers, to swap/invert the data. In some embodiments, the inverted data is output from the memory chip.

One technical effect of some embodiments used for swapping/inverting data is that some embodiments perform such operations without impacting any subarray architectures and layouts by employing existing IO bus architecture of the memory in the normal mode and the inversion mode. In some embodiments, the additional address latch, the address compare circuits, and the multiplexers used for swapping/inverting data are placed at the peripheral circuit area. This approach is simpler, faster, and saves power resulting in little to no impact to the memory subarray architecture.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical or wireless connection between the things that are connected, without any intermediary devices. The term "coupled" means either a direct electrical or wireless connection between the things that are connected or an indirect connection through one or more passive or active intermediary devices. The term "signal" means at least one current signal, voltage signal or data/clock signal. The meaning of "a," "an," and "the" include plural references. The meaning of "in" includes "in" and "on."

The terms "substantially," "close," "approximately," "near," and "about," generally refer to being within +/−20% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors in various circuits and logic blocks described here are metal oxide semiconductor (MOS) transistors, which include drain, source, gate, and bulk terminals. The transistors also include Tri-Gate and FinFET transistors, Gate All Around Cylindrical Transistors, Tunneling FET (TFET), Square Wire, or Rectangular Ribbon Transistors or other devices implementing transistor functionality like carbon nano tubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 illustrates architecture 100 with an apparatus for page copying within different sections of a memory bank, for resetting a row of memory cells, for pre-setting a row of memory cells, and/or for inverting data from a certain row of memory cells, according to some embodiments of the disclosure.

In some embodiments, architecture 100 includes Processor 101 and Memory 102. In some embodiments, Processor 101 is a microprocessor (such as those designed by Intel Corporation of Santa Clara, Calif.), Digital Signal Processors (DSPs), Field-Programmable Gate Arrays (FPGAs), Application Specific Integrated Circuits (ASICs), or Radio-Frequency Integrated Circuits (RFICs), etc.

In some embodiments, Memory 102 is a Dynamic Random Access Memory (DRAM). In other embodiments, other types of memories may be used. So as not to obscure the embodiments, a simplified version of memory architecture 100 is shown. A person skilled in the art would appreciate that there are other logic and circuits needed for complete operation of architecture 100. For example, syndrome calculators, queues, input-output buffers, decoders, multiplexers, etc., are not shown.

In some embodiments, Memory 102 includes I/O interface to communicate with Processor 101 via a bus 103, a plurality of memory banks 105 (e.g., 105-0 through 105-3) which may be logically combined, Control Logic 106, Control Logic and IO circuits 107 (e.g., 107a/b), Column Decoders 108 (e.g., 108a/b/c/d), and Word-line Decoders 109 (e.g., 109a/b/c/d). So as not to obscure the various embodiments, four memory banks (i.e., Bank-0 to Memory bank-4) are shown. However, the various embodiments are not limited to four memory banks Fewer or more memory banks can be used for various embodiments.

Here, each memory bank comprises sections or arrays (e.g., Bank-0 105-0 comprises sections Sections-0 through Section-N, where 'N' is an integer), where each section has a plurality of rows of memory cells. These memory cells are accessible by word-line (WL) decoder and column decoders (e.g., WL Decoder 109b and Column Decoder 108a are used to select a memory cell within a section of Bank-0 105-0).

In some embodiments, Control Logic and I/O circuits (e.g., Control Logic and I/O 107a) and Control Logic 106 receive instructions from Processor 101 to perform page copying operation within different sections of a memory bank, to perform resetting operation of a row of memory cells, to perform pre-setting operation of a row of memory cells, and/or to invert data from a certain row of memory cells.

So as not to obscure various embodiments, Memory 102 is described as a DRAM memory. DRAM memory 102 comprises DRAM bit-cells. These DRAM bit-cells are organized in a two dimensional (2D) fashion such that to access information from the DRAM, an address vector is given to the DRAM device and a block of information is retrieved. In some embodiments, these bit-cells are divided into semi-independent banks which can be accessed in parallel. The bank address bits in the address vector are used to select a bank. A bank can be further divided into many sections. For example, Bank-0 105-0 is divided into 'N' Sections.

These sections in the same bank share peripheral circuits such as decoders (e.g., WL Decoder 109b, Column Decoder 108a) and input/output channels (e.g., 107a). In some embodiments, only one section is allowed to be active at any given time. A section is further divided into many tiles sometimes called sub-arrays. The remaining address bits of the address vector are divided into row address bits and column address bits. The row address bits are used to select a section and a row within the selected section.

Typically, a row in a section has an equivalent of 8 Kilo bits (8 Kb) to 32 Kb in a row (i.e., 1K Bytes (KB) to 4 KB, respectively, in a row). Here, a row of memory cells is also called a page. Each bit-cell in a row of memory cells has a corresponding sense amplifier (SA) which is used to access the content of the bit cell. Since DRAM cells store information in a capacitor, sensing is done through phases. First, a bit-line (and its complement) is pre-charged to a certain voltage. Then a row is enabled after the row address is decoded. Charge (or lack of charge) in a bit-cell is then shared with a bit-line (BL) resulting in a small difference in voltage between the BL and its complement (BLB). At this time, the SA is enabled to sense and amplify the voltage difference to drive the stored content.

Data stored in the SAs are then further selected using the column address bits to go out of the DRAM device through I/O pins. Typically, a commodity DRAM device has 4 to 32 pins for data I/O (i.e., DQ pins). Examples of commodity DRAM include DRAMs that support Single Data Rate (SDRx), Double Data Rate (DDRx), and Low Power Double Data Rate (LPDDRx) interfaces, where 'x' is an integer, as defined by the Synchronous DRAM Standard Specification (SDRAM) by the Joint Electron Device Engineering Council (JEDEC), also known as the JEDEC Solid State Technology Association (See, for example, SDRAM Specification published on November 2013). In some embodiments, these steps (i.e., read, write, page copy, reset, preset, data inversion) are initiated by a command (e.g., generated by Processor 101) and performed by the internal circuitry of DRAM 102. These commands are coded using the command bits such as RAS#, CAS#, WE#, etc.

In some embodiments, Processor 101 comprises Mode Select Register (MSR) 104 which is used to set various operations/commands and performance of Memory 102. In some embodiments, MSR 104 includes a Page Copy Mode (pcm) register 104a. When pcm register 104a is set, then Memory 102 performs page copy operation between different sections of the same bank. For example, when pcm register 104a is set to logic high, then contents of Section-0 can be copied to Section-1 in Bank-0 105-0. While the embodiment of FIG. 1 illustrates MSR 104 to be part of Processor 101, MSR 104 is positioned in Memory 102, in accordance to some embodiments.

In some embodiments, MSR 104 includes a Page Preset Mode (pprst) register 104c. When pprst register 104b is set, then Memory 102 presets contents of the banks section by section (or just one row of a section). For example, when ppst register 104b is set to logic high, then contents of Section-0 in Bank-0 105-0 is set to logic one followed by setting contents of Section-1 in Bank-0 to logic one, and so on.

In some embodiments, MSR 104 includes a Page Reset Mode (prst) register 104c. When prst register 104a is set, then Memory 102 resets contents of the banks, section by section. For example, when prst register 104c is set to logic high, then contents of Section-0 in Bank-0 105-0 is set to logic zero followed by setting contents of Section-1 in Bank-0 to logic zero, and so on. In some embodiments, MSR 104 includes a Data Inversion Mode (dinv) register 104d. In one example, when dinv register 104d is set, then Memory 102 inverts the selected output (e.g., a row of memory cells within Section-0).

In some embodiments, the I/O interface for coupling bus 103 is a DDR4 interface and bus 103 is a DDR4 compliant bus coupling Memory 102 to Processor 101 as described by the DDR4 SDRAM Standard Specification Published on November 2013 by JEDEC. Other synchronous DRAM interfaces may also be used to couple Processor 101 with DRAM 102. For example, SDR, DDR, DDR2, DDR3, DDR, Wide-I/O (WIO), etc. may be used for interfacing Processor 101 with DRAM 102.

In some embodiments, the I/O interface for coupling bus 103 is a Low Power DDR4 (LPDDR4) interface and bus 103 is LPDDRx (e.g., x=4) compliant bus coupling Memory 102 to Processor 101 as described by the LPDDR4 Standard Specification Published on August 2014 by JEDEC.

While the embodiment of FIG. 1 is illustrated with two distinct components in Processor 101 and Memory 102, in some embodiments, Processor 101 and Memory 102 can be packaged together as a single unit. In some embodiments, Processor 101 and Memory 102 are implemented using three dimensional integrated circuit (3D IC) technology where various dies are stacked on each other. For example, various dies or components of Memory 102 may be implemented as dies that are stacked on a die of Processor 101 to form a stacked or 3D IC. In some embodiments, Processor 101 and several memory chips (i.e., Memory 102) are mounted on a computer system board.

Figure 2:
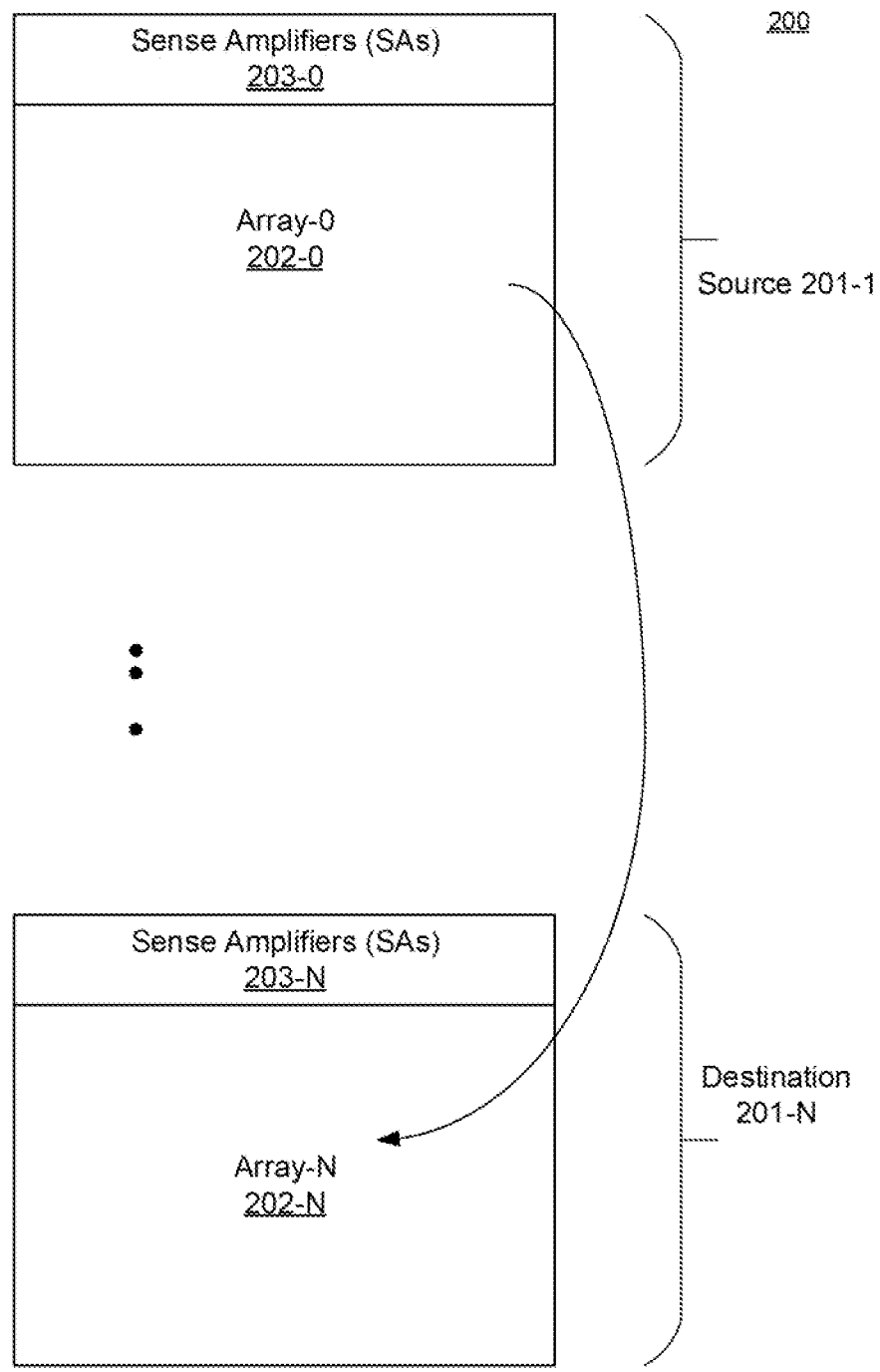
FIG. 2 illustrates a high level architecture showing page copy within different sections of a bank of memory, according to some embodiments of the disclosure.

FIG. 2 illustrates a high level architecture 200 for performing a page copy operation within different sections of a bank of memory, according to some embodiments of the disclosure. It is pointed out that those elements of FIG. 2 having the same reference numbers (or names) as the elements of any other figure can operate or function in any manner similar to that described, but are not limited to such.

In some embodiments, contents of one section are copied over to another section of the same bank. Architecture 200 shows one such embodiment. In this example, one section is labeled as the source section (e.g., Source 201-1) and another section is labeled as a destination section (e.g., Destination 201-N). As described with reference to FIG. 1, each section of a bank of memory has associated sense amplifiers. For example, source Array-0 202-0 (e.g., Section-0) has associated Sense Amplifiers 203-0. Likewise, destination Array-N 202-N (e.g., Section-N) has associated Sense Amplifiers 203-N. In some embodiments, upon receiving a page copy command (e.g., when pcm in MSR 104 is set), contents of Array-0 202-0 are copied over to Array-N 202-N without data traffic between Processor 101 and Memory 102.

Figure 3:
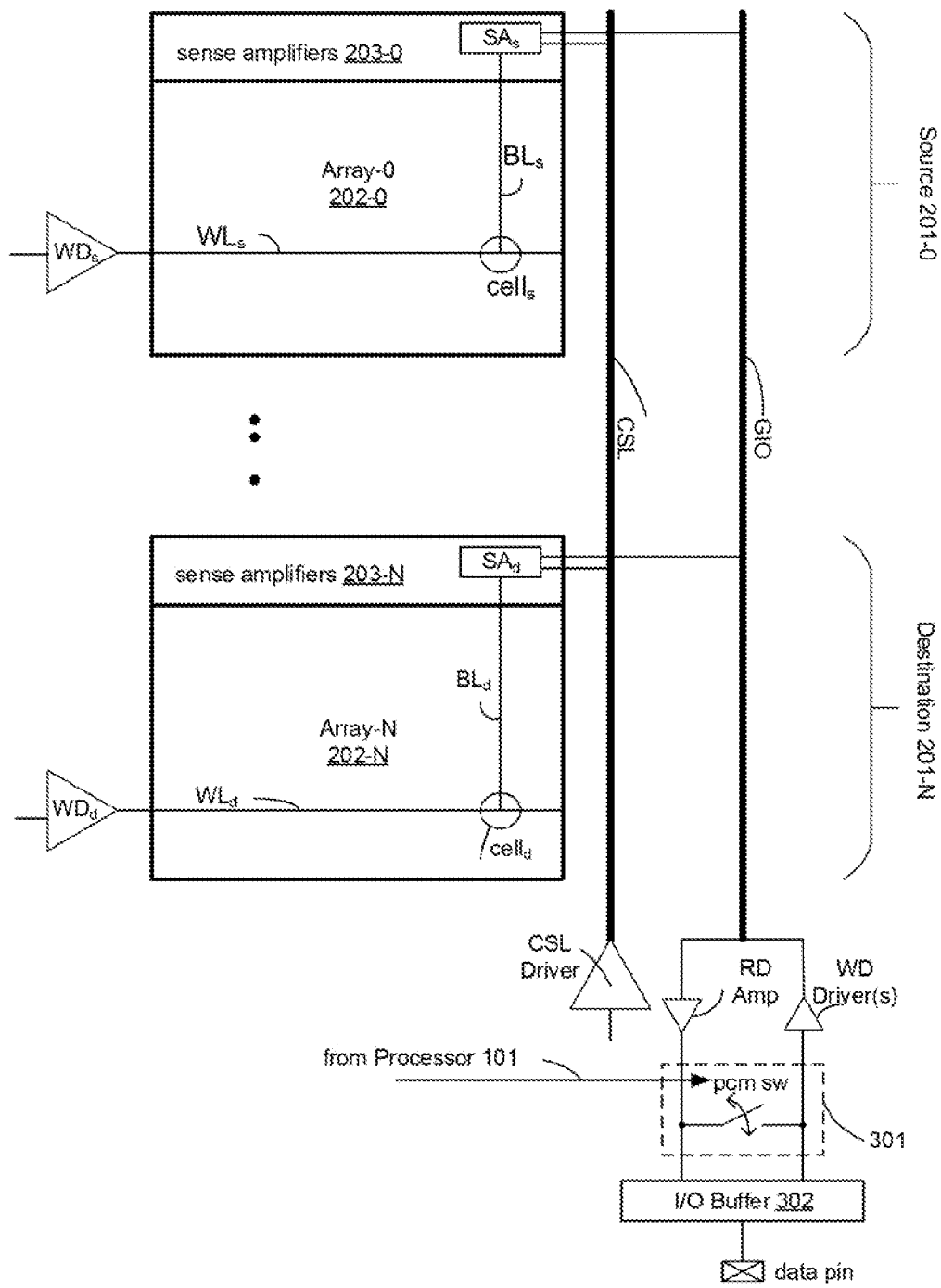
FIG. 3 illustrates an architecture showing page copy within different sections of a bank of memory with column select lines (CSLs) extending in the same direction as the global input-output (GIO) lines, according to some embodiments of the disclosure.

FIG. 3 illustrates architecture 300 for performing page copy operation within different sections of a bank of memory with column select lines (CSLs) extending in the same direction as the global input-output (GIO) lines, according to some embodiments of the disclosure. It is pointed out that those elements of FIG. 3 having the same reference numbers (or names) as the elements of any other figure can operate or function in any manner similar to that described, but are not limited to such.

Architecture 300 shows a more detailed view of FIG. 2. In this example, CSLs and GIO lines are parallel to one another. CSLs are driven by CSL Driver(s) while GIO lines are driven by Write Driver(s). GIO lines also carry data read from the memory cells. This data is then amplified by the Read Amplifier (RD Amp). Typically, the amplified data is provided to I/O Buffer 302 which is driven out on the data pin (DQ). In some embodiments, architecture 300 includes a pcm switch (sw) 301 coupled between the output of RD Amp and the input of Write Driver. In some embodiments, pcm sw 301 is controllable by a page copy command sent by Processor 101 to Memory 102. This internal mechanism provided by pcm sw 301 allows for page-by-page copy between different sections of a bank of memory without data transfers on the data pins. In some embodiments, pcm sw 301 is implemented as a pass-gate. In other embodiments, any other suitable circuit may be used to implement pcm sw 301.

In some embodiments, to copy contents from a row of memory cells in Source 201-0 to a row of memory cells in Destination 201-N, source WL driver ($WD_s$) is enabled which activates a source WL ($WL_s$). By activating $WL_s$, a row of memory cells (i.e., a page) is activated. This row of memory cells is the source memory cells (i.e., source page). One such example cell is shown as cells. In some embodiments, upon activating the $WL_s$, data from the source cells are latched by SAs 203-0. One such example SA is shown as SAs.

In some embodiments, the latched data from SAs 203-0, for a row of memory cells activated by $WL_s$, is low swing data which is amplified by the RD Amp that converts the low swing data to full swing data (also referred here as CMOS data). The RD Amp also latches the data received at its input. In some embodiments, the RD Amp is implemented as a clocked comparator which latches the input data at every rising or falling edge of a clock signal.

In some embodiments, the destination WL driver ($WD_d$) is enabled which activates a destination WL ($WL_d$). In some embodiments, the destination $WD_d$ is activated after Memory 102 waits for a predetermined amount of time (e.g., tRCD). The term "tRCD" here generally refers to a timing margin for the SA to sense and amplify data from a selected cell, when WL is activated, such that the voltage split between BL and BLB is above a threshold. tRCD may be defined as a delay timing specification associated with a delay time from Row Activation (i.e., ACT command) to Column operation (i.e., READ/WRITE command) or Column ACT command. By activating $WL_d$, a row of memory cells is activated. This row of memory cells is the destination (or target) memory cells (i.e., destination page). One such example cell is shown as $cell_d$. In some embodiments, upon activating $WL_d$, data from the destination cells are latched by SAs 203-N. One such example SA is shown as $SA_d$.

While the embodiment of FIG. 2 is illustrated by first latching source data and then latching destination data, the process can be reversed. For example, destination data may be latched first followed by latching of source data. In some embodiments, pcm sw 301 is turned on to couple data stored in source SAs 203-0 to the input of the Write Driver(s). In some embodiments, pcm sw 301 is controllable by a copy command issued by Processor 101. In some embodiments, the copy command also enables the RD Amp and the Write Driver(s) such that the RD Amp is enabled and disabled before the Write Driver(s) are enabled.

In some embodiments, the coupled data (i.e., data from the output of the RD Amp which is coupled to the Write Driver(s) by pcm sw 301) is then driven out by the Write Driver(s) over the GIO line. In some embodiments, the driven data on the GIO line overrides the data in the destination SAs 203-N. In some embodiments, the new data in the destination SAs 203-N charges the respective $BL_d$ and $BLB_d$ which writes the new data (i.e., the source data) to the destination row of memory cells activated by the $WL_d$. In some embodiments, this process (i.e., burst copy) is repeated till all pages in a section of a bank are copied over to another section in the same bank.

FIG. 4 illustrates plot 400 showing a timing diagram of various control signals for performing the page copy operation within different sections of a bank of memory with CSLs extending in the same direction as the GIO lines, according to some embodiments of the disclosure. It is pointed out that those elements of FIG. 4 having the same reference numbers (or names) as the elements of any other figure can operate or function in any manner similar to that described, but are not limited to such. Here, x-axis is time and the y-axis for each waveform is voltage.

Plot 400 shows four signals—voltage on the GIO line, complement of GIO line (i.e., GIOB), CSL signal, RD Amp Enable signal, and Write Driver (WD) Enable signal. To copy data, in some embodiments, Control Logic 106 enables the CSL drivers at time t1 to enable the process of page copying. In some embodiments, before time t1, source data is latched by source SAs 203-0 as described with reference to FIG. 3. Referring back to FIG. 4, in some embodiments, at time t2, RD Amp is enabled by the copy command received from Processor 101. As such, RD Amp Enable signal is asserted. During times t2 and t3, data from source SAs 203-0 is latched by the RD Amp. In some embodiments, data from source SAs 203-0, which is driven on the GIO line, is low swing data. The term "low swing data" generally refers to data that swings between the two rails—power supply and ground—such that the signal maximum and minimum points are always below power supply and/or above ground, respectively.

At time t3, the Write Driver(s) are enabled by the copy command signal. As such, the WD Enable signal is asserted. At this time, pcm sw 301 is closed which copies data latched by the RD Amp Enable signal to the input of the Write Drivers. During times t3 and t4, the Write Driver(s) drive the source data on the GIO lines which overrides the data stored in destination SAs 203-N. This data driven by the Write Driver(s) is full-swing data. The term "full-swing data" generally refers to data that swings between the two rails—power supply and ground—such that the signal maximum and minimum points are power supply and ground, respectively.

In some embodiments, after destination SAs 203-N latch the new data, CSL drivers are turned off, which disable the CSL lines. For normal read and write operations, RD Amp Enable and WD Enable do not assert at the same time within one CSL cycle. In some embodiments, for page copy operation, both RD Amp Enable and WD Enable signals are asserted within the CSL cycle.

Figure 5A:
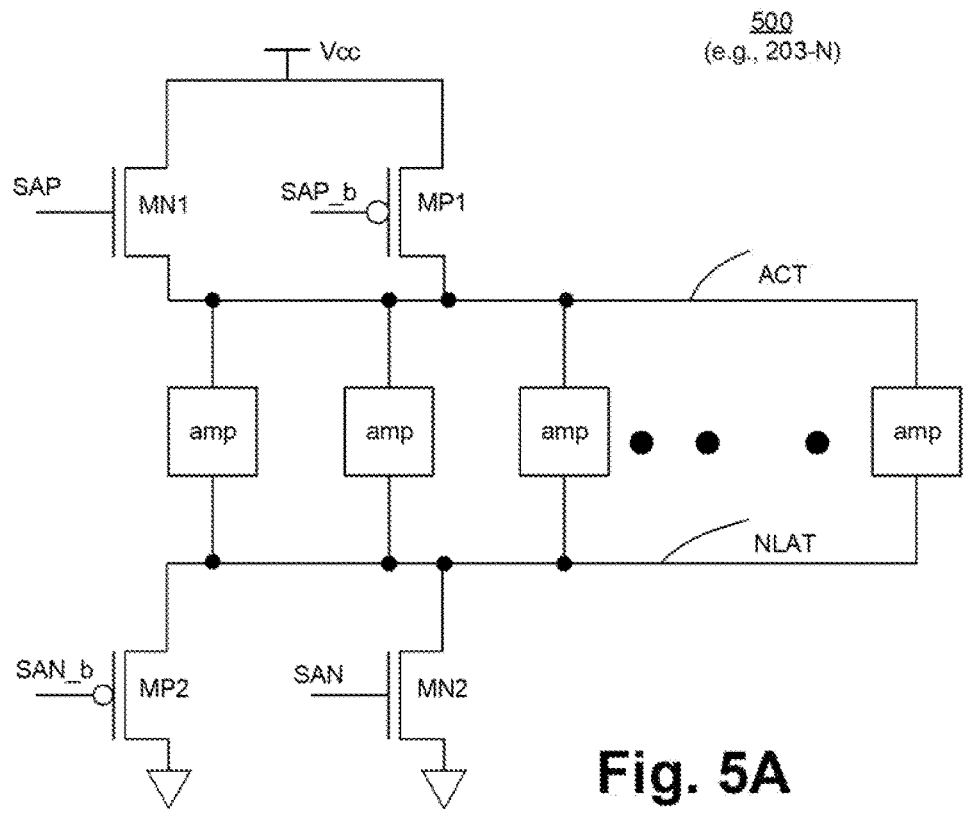
FIG. 5A illustrates an adjustable strength sense amplifier (SA) which is operable to weaken its drive strength during the page copy operation, according to some embodiments of the disclosure.

FIG. 5A illustrates adjustable strength SAs 500 (e.g., 203-N) which are operable to weaken their drive strength during the page copy operation, according to some embodiments of the disclosure. It is pointed out that those elements of FIG. 5A having the same reference numbers (or names) as the elements of any other figure can operate or function in any manner similar to that described, but are not limited to such.

In some embodiments, SAs 500 comprise amplifying (amp) circuits (e.g., cross-coupled latch, which is not shown here), header transistors, and footer transistors. In some embodiments, header transistors comprise p-type transistor(s) MP1 and n-type transistor(s) MN1 coupled in parallel to each other. In some embodiments, the source terminal of transistors MN1 are coupled to the node ACT and the drain terminals of transistors MN1 are coupled to the power supply (Vcc), where transistor(s) MN1 are controlled by SAP.

In some embodiments, the drain terminals of transistors MP1 are coupled to the node ACT and the source terminals of transistors MP1 are coupled to Vcc, where transistor(s) MP1 are controlled by SAP_b (which is complementary to SAP). Here, the terms for node names and signals are interchangeably used. For example, the term SAP may be used to refer to node SAP or signal SAP, depending on the context of the sentence.

In some embodiments, the footer transistors comprise p-type transistor(s) MP2 and n-type transistor(s) MN2 coupled in parallel to each other. In some embodiments, the drain terminal of transistors MN2 are coupled to the node NLAT and the source terminals of transistors MN1 are coupled to ground, where the transistor(s) MN2 are controlled by SAN. In some embodiments, the source terminals of transistors MP2 are coupled to the node NLAT and the drain terminals of transistors MP2 are coupled to ground, where transistor(s) MP2 are controlled by SAN_b (complementary to SAN).

In some embodiments, during the page copy operation, the destination SAs are weakened relative to the source SAs so that it is easier to write into the destination SAs in case there is a conflict between the source and destination SAs in that both the source and destination SAs are driving on to the GIO lines at the same time. In some embodiments, when the destination SAs are being written into, the header and/or footer transistors reduce the drive strength of the destination SAs. In some embodiments, during normal operation, SAs operate with normal strength and so transistors MN1 and MP2 are turned off by the SAP and SAN_b signals, respectively. In some embodiments, during page copy mode, transistors MP1 and MN2 are turned off by SAP_b and SAN signals to reduce the driving strength of the amplifiers.

Figure 5B:
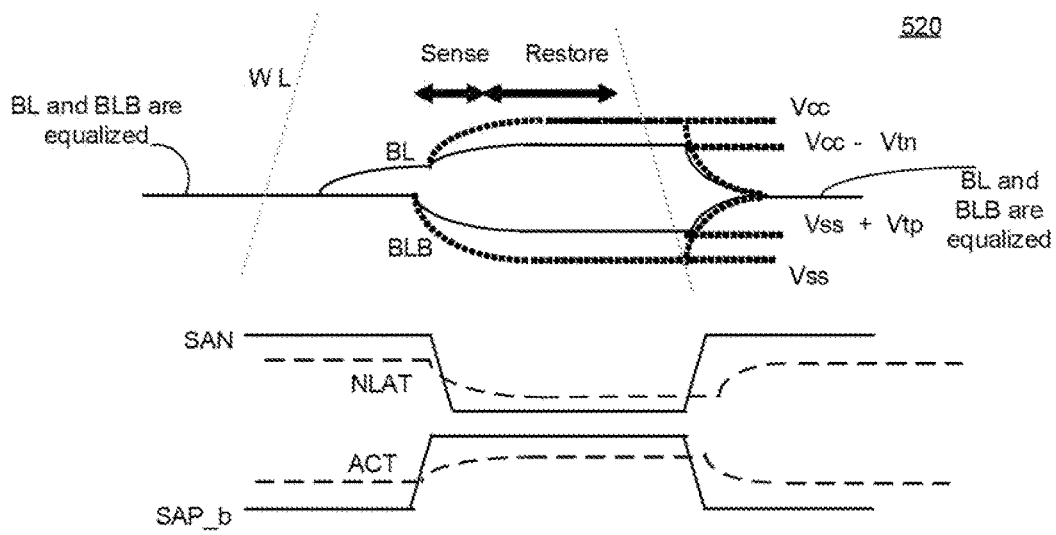
FIG. 5B illustrates a timing diagram of various signals of the SA during the page copy operation, according to some embodiments of the disclosure.

FIG. 5B illustrates timing diagram 520 of various signals of SA 500 during the page copy operation, according to some embodiments of the disclosure. It is pointed out that those elements of FIG. 5B having the same reference numbers (or names) as the elements of any other figure can operate or function in any manner similar to that described, but are not limited to such. Here, x-axis is time and y-axis for all waveforms is voltage.

Initially, before the SA latches data and before a WL is activated, the BL and BLB are equalized (i.e., substantially set to the same voltage level (e.g., half of Vcc)). After the WL is activated (as shown by the gray dotted line), depending on the charge stored on the memory cell, voltages on the BL and BLB begin to drift apart. In some embodiments, during normal operation, when the transistors MP1 and MN2 are enabled while the transistors MN1 and MP2 are disabled, the BL and BLB charge to rail levels. For example, the BL charges to Vcc and the BLB discharges to Vss. In some embodiments, during the page copy operation (i.e., SAN transitions from high to low, and SAP_b transitions from low to high) when the transistors MP1 and MN2 are disabled while the transistors MN1 and MP2 are enabled, the BL and BLB charge to one threshold level below the rail levels. For example, the BL charges to Vcc−Vtn and the BLB charges to Vss+Vtp, where Vtn is the threshold voltage of the transistor MN1 and Vtp is the threshold voltage of the transistor MP2.

Figure 6A:
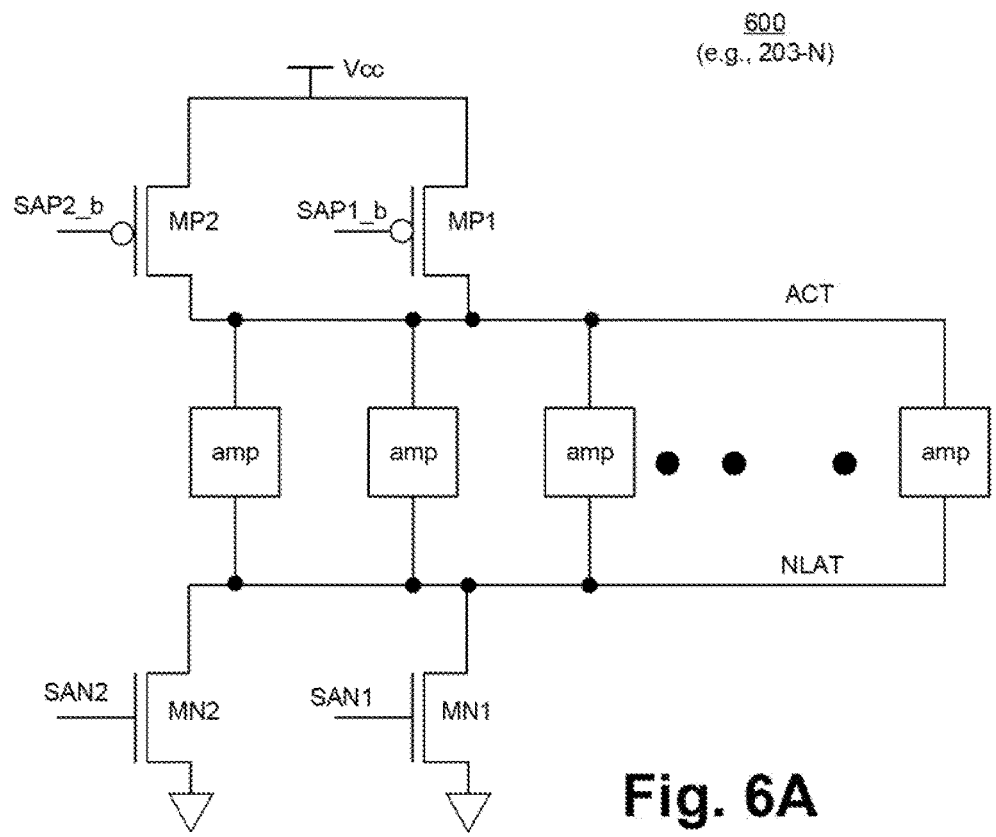
FIG. 6A illustrates an adjustable strength SA which is operable to weaken its drive strength during the page copy operation, according to some embodiments of the disclosure.

FIG. 6A illustrates adjustable strength SAs 600 which are operable to weaken their drive strength during the page copy operation, according to some embodiments of the disclosure. It is pointed out that those elements of FIG. 6A having the same reference numbers (or names) as the elements of any other figure can operate or function in any manner similar to that described, but are not limited to such.

In some embodiments, SAs 600 comprise amplifying (amp) circuits (e.g., cross-coupled latch, which is not shown here), header transistors, and footer transistors. In some embodiments, the header transistors comprise p-type transistor(s) MP1 and MP2 coupled in parallel to each other. In some embodiments, the drain terminals of transistors MP1 and MP2 are coupled to the node ACT and the source terminals of transistors MP1 and MP2 are coupled to Vcc, where the transistor(s) MP1 are controlled by SAP1_b (complementary to SAP1) while the transistor(s) MP2 are controlled by SAP2_b (complementary to SAP2).

In some embodiments, the footer transistors comprise n-type transistor(s) MN1 and MN2 coupled in parallel to each other. In some embodiments, the drain terminals of transistors MN1 and MN2 are coupled to the node NLAT and the source terminals of transistors MN1 and MN2 are coupled to ground, where the transistor(s) MN1 are controlled by the SAN1 signal and the transistors MN2 are controlled by the SAN2 signal. In some embodiments, the transistor(s) MN1 are stronger (e.g., have larger size and drive strength) than the transistor(s) MN2, while the transistor(s) MP1 are stronger than the transistor(s) MP2.

In some embodiments, during page copy operation, the destination SAs are weakened relative to the source SAs so that it is easier to write data into the destination SAs in case there is a conflict between the source and destination SAs (e.g., when both the source and destination SAs are driving on the same line at the same time). In some embodiments, when the destination SAs are being written into, the header and/or footer transistors for the sense amplifiers reduce the drive strength of the destination SAs. In some embodiments, during normal operation, SAs 600 operate with normal strength and so transistors MN2 and MP2 are turned off by SAN2 and SAP2_b signals respectively, while the transistors MP1 and MN2 are turned on. In some embodiments, during page copy mode, the transistors MP1 and MN1 are turned off by SAP1_b and SAN1 signals to reduce the driving strength of the amplifiers.

Figure 6B:
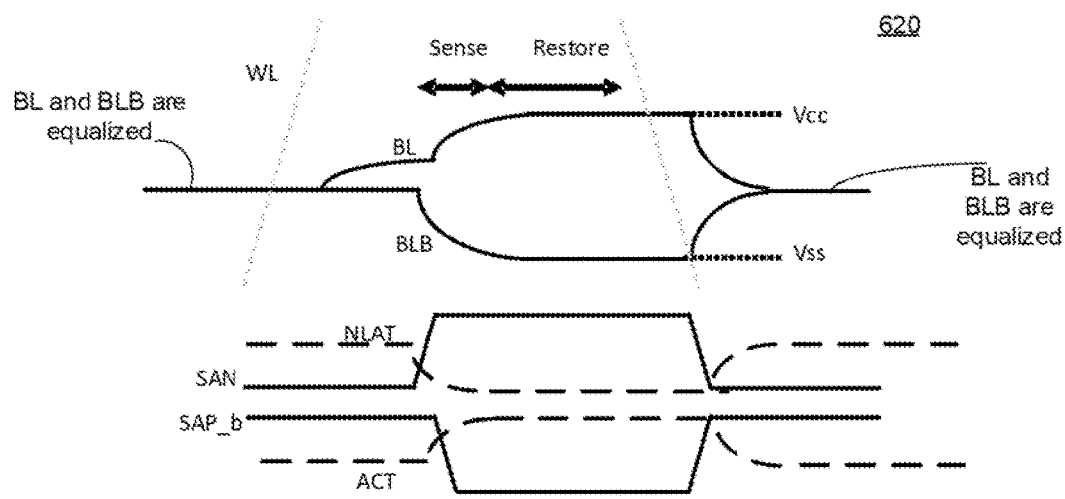
FIG. 6B illustrates a timing diagram of various signals of the SA during the page copy operation, according to some embodiments of the disclosure.

FIG. 6B illustrates 620 timing diagram of various signals of SAs 600 during the page copy operation, according to some embodiments of the disclosure. It is pointed out that those elements of FIG. 6B having the same reference numbers (or names) as the elements of any other figure can operate or function in any manner similar to that described, but are not limited to such. Here, x-axis is time and y-axis for all waveforms is voltage.

Initially, before SA latches data and before a WL is activated, BL and BLB are equalized (i.e., substantially set to the same voltage level (e.g., half of Vcc)). After the WL is activated (as shown by the gray dotted line), depending on the charge stored on the memory cell, voltages on BL and BLB nodes begin to drift apart. In some embodiments, during normal operation when transistors MP1 and MN2 are enabled while transistors MN1 and MP2 are disabled, voltage on BL and BLB nodes charge to rail levels. For example, BL node charges to Vcc and BLB node charges to Vss. During normal operation, SAP1_b node has a low voltage (which turns on transistors MP1), SAP_2 node has a high voltage (which turns off transistors MP2), SAN1 has a high voltage (which turns on transistors MN1), and SAN2 has a low voltage (which turns off transistor MN2). During normal operation, SAs 600 operate with normal strength.

In some embodiments, during page copy operation (i.e., SAN2 signal transitions from low to high, SAN1 signal transitions from high to low, SAP2_b signal transitions from high to low, and SAP1_b signal transitions from low to high) transistors MP1 and MN1 are disabled while transistors MP2 and MN2 are enabled. During page copy operation, SAs 600 operate with weaker strength because weaker transistors MP2 and MN2 are turned on while stronger transistors MP1 and MN1 are turned off.

Figure 7:
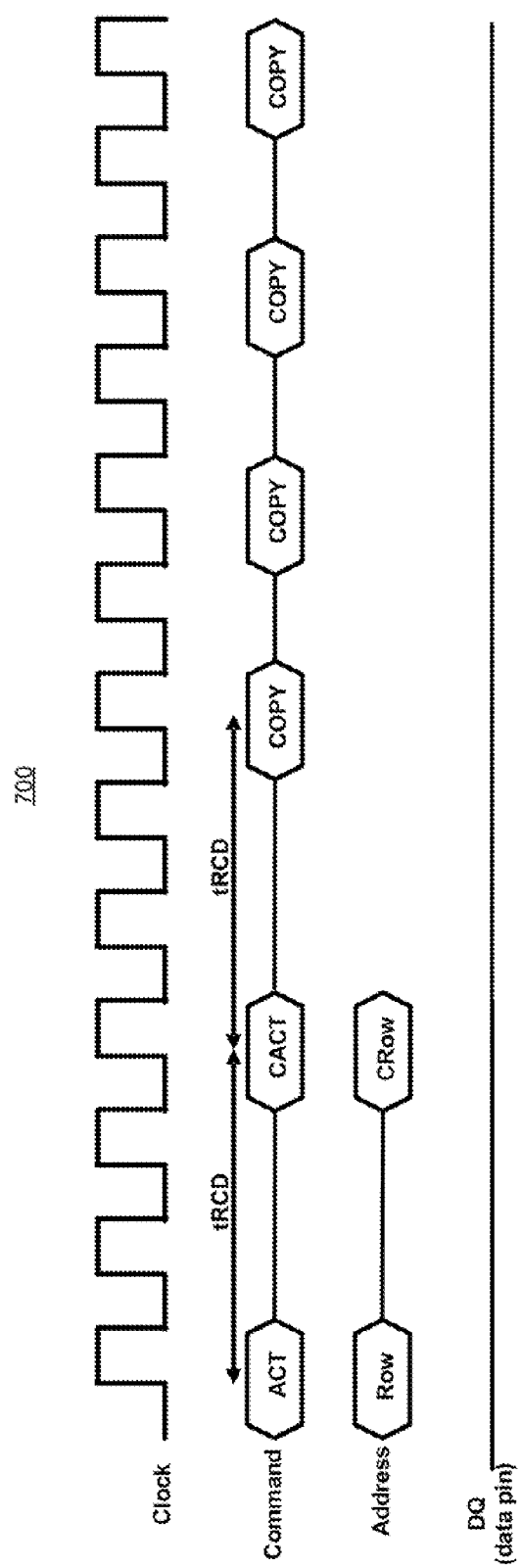
FIG. 7 illustrates timing diagram for copying multiple columns (i.e., Burst READ or Burst WRITE operations), according to some embodiments of the disclosure.

FIG. 7 illustrates timing diagram 700 for copying multiple columns (i.e., Burst READ or Burst WRITE operations) from a source section to a destination section, according to some embodiments of the disclosure. It is pointed out that those elements of FIG. 7 having the same reference numbers (or names) as the elements of any other figure can operate or function in any manner similar to that described, but are not limited to such. Here, x-axis is time and y-axis is voltage or an action item.

In some embodiments, upon receiving the page copy command, during the first clock cycle, the source WL is activated (i.e., Command ACT) to latch data from a row of memory cells (i.e., Address Row) into the source SAs. After waiting for a predetermined time tRCD (which in this example is three clock cycles), CACT command (i.e., Command Copy ACT (CACT)) is issued to activate the Destination WL and SA. The destination WL is then activated and data from the destination row of memory cells is latched into the destination SAs. The destination SAs are weak but ready for receiving the copy data from the Source SAs. This latched data is eventually overwritten by the data latched by the RD Amp. As such, data from a row of memory cells, associated with an address, is copied over (i.e., Address CRow).

In some embodiments, the COPY process operates the CSL activation specified by the column address. The data is then read by the RD Amp and written back using the Write Drivers. In some embodiments, after copying data from the first row of memory cells, a burst copy process can begin to copy the whole page data consecutively. The burst operation is indicated by the multiple COPY action commands. For example, COPY command is repeated with different column addresses to copy a whole page from the source page to the destination page. During the page copy process, no data transfer takes place on the data pins, which is illustrated by an inactive DQ data pin.

Figure 8:
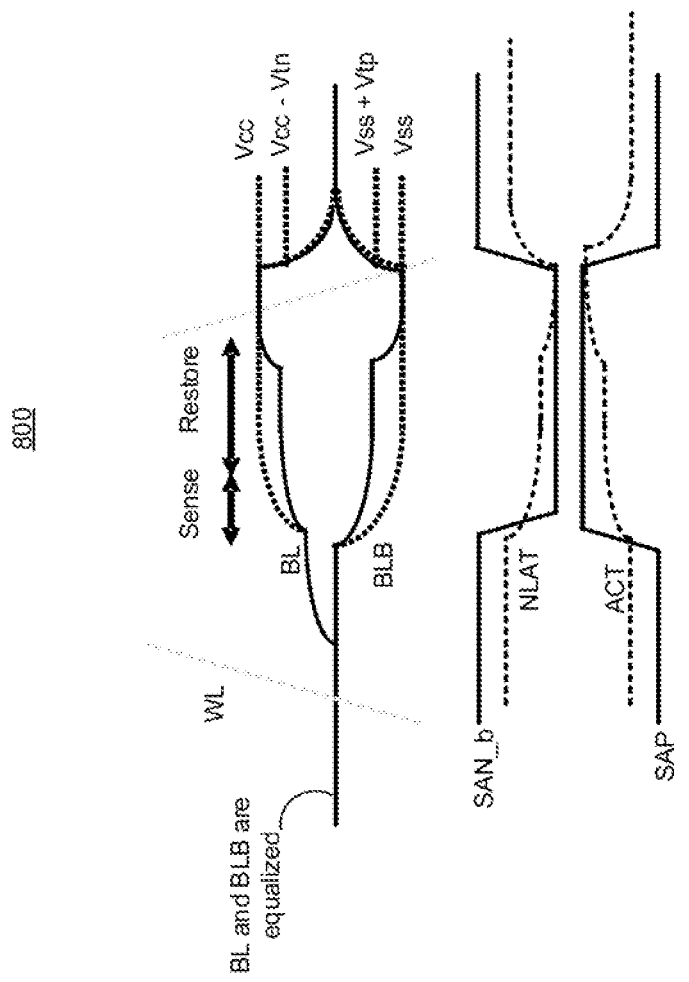
FIG. 8 illustrates a timing diagram of various signals of the SA at the end of the burst operation, according to some embodiments of the disclosure.

FIG. 8 illustrates timing diagram 800 of various signals of the SA and BL at the end of the burst operation at the destination section, according to some embodiments of the disclosure. It is pointed out that those elements of FIG. 8 having the same reference numbers (or names) as the elements of any other figure can operate or function in any manner similar to that described, but are not limited to such. Here, x-axis is time and y-axis for all waveforms is voltage.

Initially, before the SA latches data and before a WL is activated, the BL and BLB are equalized (i.e., substantially set to the same voltage level (e.g., half of Vcc)). After the WL is activated (as shown by the gray dotted line), depending on the charge stored on the memory cell, voltages on the BL and BLB nodes begin to drift apart. In some embodiments, during normal operation when the transistors MP1 and MN2 are enabled while the transistors MN1 and MP2 are disabled, voltage on the BL and BLB nodes charge to rail levels. For example, voltage on the BL node charges to Vcc and voltage on the BLB node charges to Vss.

In some embodiments, during the copy operation (i.e., SAN signal transitions from high to low, and SAP_b signal transitions from low to high) when transistors MP1 and MN2 are disabled while transistors MN1 and MP2 are enabled, voltages on the BL and BLB nodes charge to a threshold level below rail levels. For example, the BL node charges to Vcc–Vtn and the BLB node charges to Vss+Vtp, where Vtn is the threshold voltage of transistor MN1 and Vtp is the threshold voltage of transistor MP2.

In some embodiments, before the source WL is deactivated and the SAs are closed (i.e., the inputs to the SA (BL and BLB) are equalized), and after pre-charge command (PRE) is issued, the strength of the SA is adjusted to its normal strength (i.e., SAs are reverted back to normal operation). As such, voltages on the BL and BLB nodes charge to their respective rails (here, the voltage on the BL node charges to Vcc and the voltage on the BLB node discharges to Vss). In some embodiments, the SAs are reverted to their normal strength after the burst copy operation completes. During normal operation, the header transistors allow the SA to drive an output to full swing (i.e., full Vcc swing is achieved by driving at normal drive strength) while the footer transistors allow the SA to drive the output to full swing (i.e., full Vss swing is achieved by driving at normal drive strength).

Figure 9:
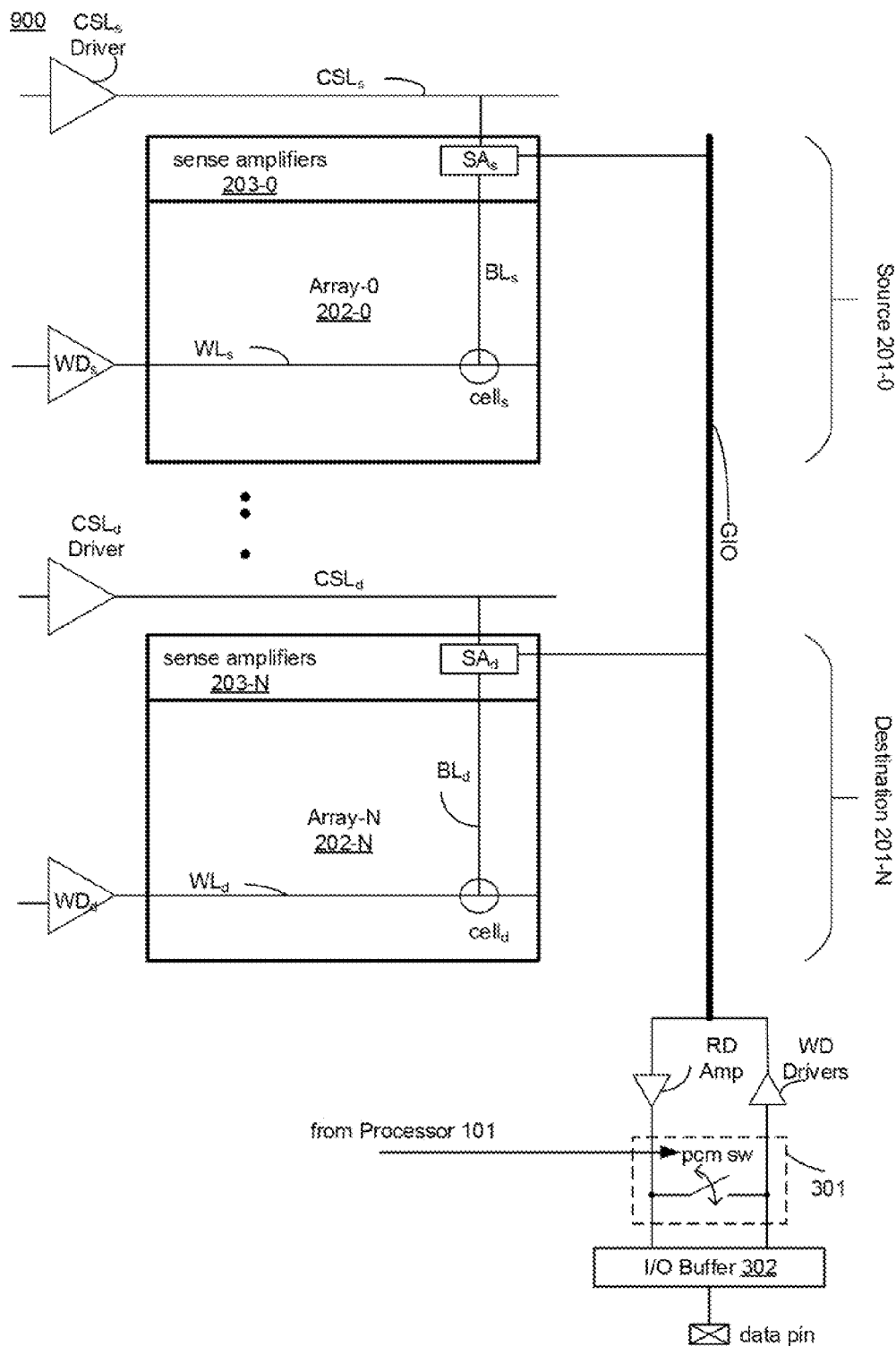
FIG. 9 illustrates an architecture for performing the page copy operation within different sections of a bank of memory with CSLs extending in a direction perpendicular as the GIO lines, according to some embodiments of the disclosure.

FIG. 9 illustrates architecture 900 for performing the page copy operation within different sections of a bank of memory with CSLs extending in a direction perpendicular as the GIO lines, according to some embodiments of the disclosure. It is pointed out that those elements of FIG. 9 having the same reference numbers (or names) as the elements of any other figure can operate or function in any manner similar to that described, but are not limited to such. FIG. 9 is described with reference to FIG. 3. So as not to obscure the embodiment of FIG. 9, differences between FIG. 9 and FIG. 3 are described.

In some embodiments, depending on the type of DRAM Memory architecture (e.g., whether CSL lines are in parallel to the GIO line or perpendicular to the GIO line), there may be slight differences in implementation details for page copy operation. For example, when the CSL lines are in parallel to the GIO lines, then the CSL drivers enable the CSL lines before the RD Amp is enabled, and disable the CSL lines after the Write Driver(s) are disabled (i.e., after Write Driver(s) have driven the to-be copied data over the GIO lines to the destination page).

Compared to FIG. 3, here the source $CSL_s$ are oriented perpendicular to the GIO line. For example, the source $CSL_s$ which is driven by the source $CSL_s$ Driver extends in a direction perpendicular to the GIO line. Likewise, destination $CSL_d$ which is driven by the destination $CSL_d$ Driver extends in a direction perpendicular to the GIO line. In some embodiments, the CSL extends in the same direction as the WL. For example, the source $CSL_s$ extends in a direction parallel to the source $WL_s$, and the destination $CSL_d$ extends in a direction parallel to the destination $WL_d$.

In some embodiments, after the source $SA_s$ latches data from the selected source $WL_s$, the RD Amp reads the latched data. In some embodiments, pcm sw 301 turns on and couples the output of the RD Amp to the Write Driver(s) which drive the data on to the GIO lines. In some embodiments, if the CSL drivers are enabled, then both the source and destination SAs are enabled (i.e., both the source and destination SAs are driving on to the GIO lines).

In some embodiments, the source $CSL_s$ and destination $CSL_d$ are enabled sequentially to resolve the possibility of the SAs fighting each other (e.g., by driving on the same line at the same time). In some embodiments, the source CSLs are enabled first, and during that time, the RD Amp is enabled to latch the data on the GIO line. In some embodiments, the destination $CSL_d$ is enabled after the source CSLs is disabled. In some embodiments, during the time when the destination $CSL_d$ is enabled, the Write Driver is enabled and drives the data coupled from pcm sw 301 to the GIO lines. In some embodiments, by sequentially enabling and disabling the CSL lines, the possible problem associated with fighting SAs is avoided.

Figure 10:
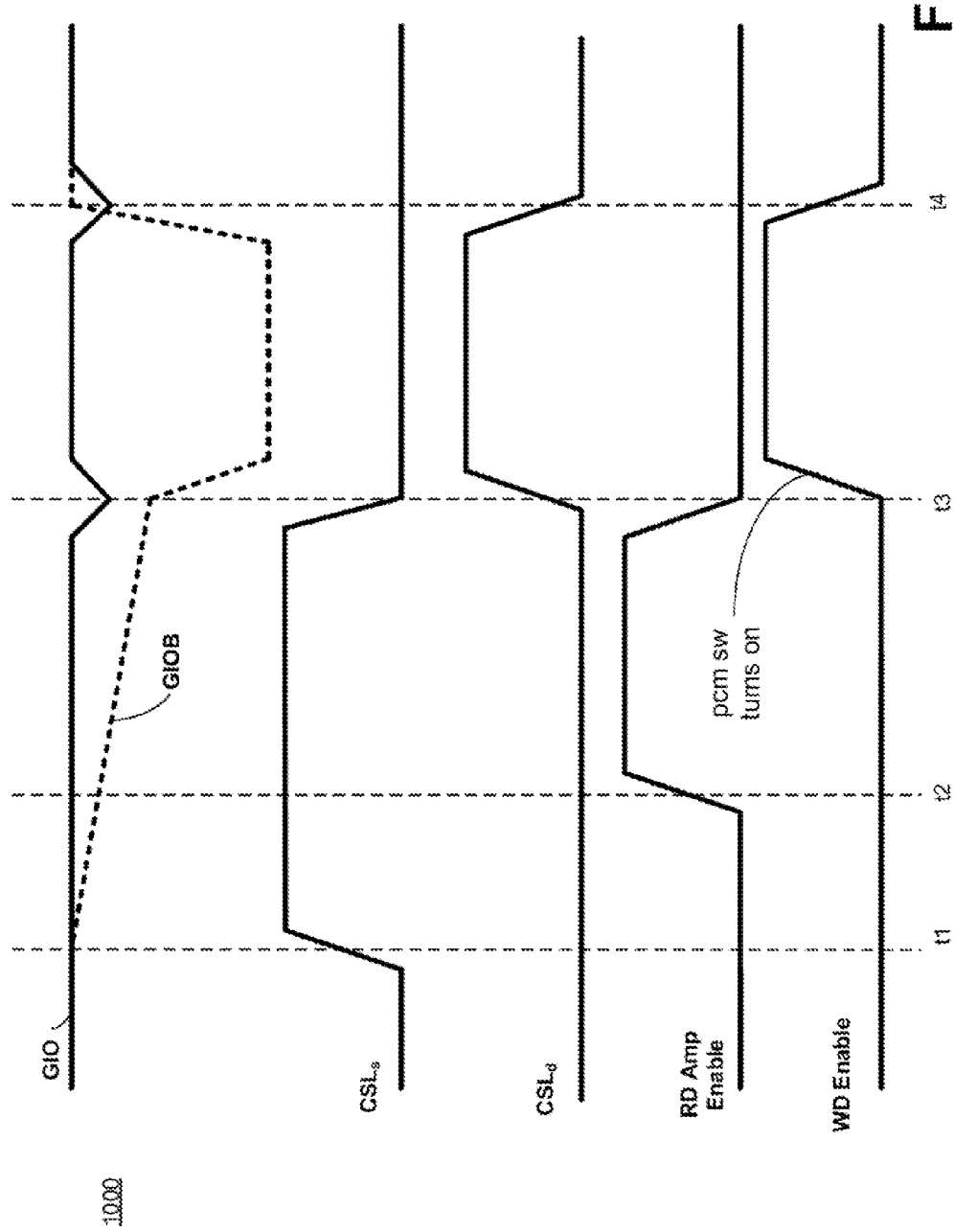
FIG. 10 illustrates a plot showing a timing diagram of various control signals for performing the page copy operation between different sections of a bank of memory with CSLs extending in a direction perpendicular as the GIO lines, according to some embodiments of the disclosure.

FIG. 10 illustrates plot 1000 showing timing diagram of various control signals for performing page copy operation within different sections of a bank of memory with the CSLs extending in a direction perpendicular as the GIO lines, according to some embodiments of the disclosure. It is pointed out that those elements of FIG. 10 having the same reference numbers (or names) as the elements of any other figure can operate or function in any manner similar to that described, but are not limited to such. Here, x-axis is time and the y-axis for each waveform is voltage.

Plot 1000 shows four signals—voltage on the GIO line (and complement of GIO line (i.e., GIOB)), CSL signal, RD Amp Enable signal, and Write Driver (WD) Enable signal. To copy data, in some embodiments, Control Logic 106 enables the source CSL drivers at time t1 to enable the process of page copying. In some embodiments, between times t1 and t2, the source data is latched by source SAs 203-0 as described with reference to FIG. 9.

Referring back to FIG. 10, in some embodiments, at time t2, the RD Amp is enabled by the copy command received from Processor 101. As such, the RD Amp Enable signal is asserted. During times t2 and t3, data from the source SAs 203-0 is latched by the RD Amp. In some embodiments, data from source SAs 203-0, which is driven on the GIO line, is low swing data.

At time t3, the source CSL is disabled and the destination $CSL_d$ is enabled as indicated by the falling edge of CSL and the rising edge of $CSL_d$ signals. During that time, the Write Driver(s) are enabled by the copy command signal. As such, the WD Enable signal is asserted. At this time, pcm sw 301 is closed which copies data latched by the RD Amp Enable signal to the input of the Write Drivers. During times t3 and t4, the Write Driver(s) drive the source data on the GIO lines, which overrides the data stored in the destination SAs 203-N. This data driven by the Write Driver(s) is full-swing data. In some embodiments, after destination SAs 203-N latch the new data, the destination $CSL_d$ drivers are turned off, which disable the destination $CSL_d$ lines. For normal read and write operations, the RD Amp Enable and the WD Enable do not assert at the same time.

Figure 11:
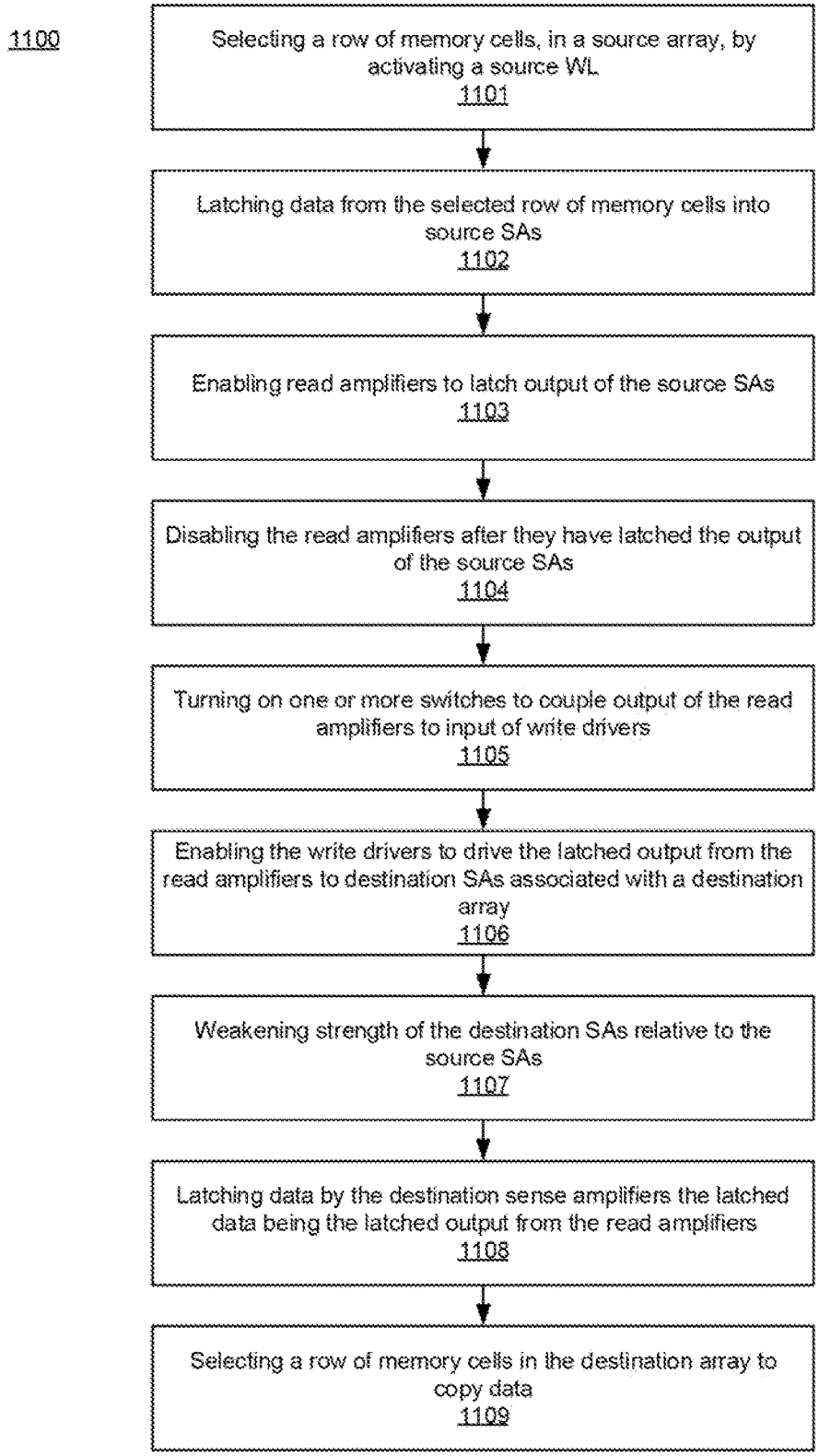
FIG. 11 illustrates a flowchart of a method for performing the page copying operation between different sections within a bank of memory, according to some embodiments of the disclosure.

FIG. 11 illustrates flowchart 1100 of a method for page copying sections within a bank of memory, according to some embodiments of the disclosure. It is pointed out that those elements of FIG. 11 having the same reference numbers (or names) as the elements of any other figure can operate or function in any manner similar to that described, but are not limited to such.

Although the blocks in the flowchart with reference to FIG. 11 are shown in a particular order, the order of the actions can be modified. Thus, the illustrated embodiments can be performed in a different order, and some actions/blocks may be performed in parallel. Some of the blocks and/or operations listed in FIG. 11 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 1101, a source WL driver activates a source $WL_s$ to select a row of memory cells in a bank whose data are to be copied to another row of memory cells in a different section of the same memory bank. At block 1102, data from the selected row of memory cells is latched into the source SAs. In some embodiments, the output of the SAs are driven to the GIO lines. At block 1103, after passage of predetermined time tRCD, the RD Amps are enabled by the page copy command to latch the output of the source SAs. In some embodiments, the output of the RD Amp is full-rail swing signals. At block 1104, the RD Amps are disabled after they have successfully latched the data.

At block 1105, one or more switches pcm sw 301 are turned on by the page copy command to couple data from the output of the RD Amp to the input of Write Driver(s). At block 1106, the Write Driver(s) are enabled to drive the copied data to the GIO lines. In some embodiments, the output of Write Driver(s) is full swing data which can override data on the selected destination SAs. At block 1107, the strength of destination SAs is weakened relative to the source SAs so that the Write Drivers can override data in the destination SAs.

At block 1108, the data is latched by the enabled destination SAs. This data is the data copied over from the source section. At block 1109, the destination WL is selected so that the row of memory cells which are to be written are selected. Since the destination SAs are made weaker than normal, the data driven by the Write Driver(s) overrides the data stored in the destination SAs and hence the destination row of memory cells. While block 1109 is shown after block 1108, block 1109 may be performed after block 1102 in accordance to some embodiments. In some embodiments, the sequence of the blocks is changed without impacting the process of copying data from source and destination memory sections.

Figure 12:
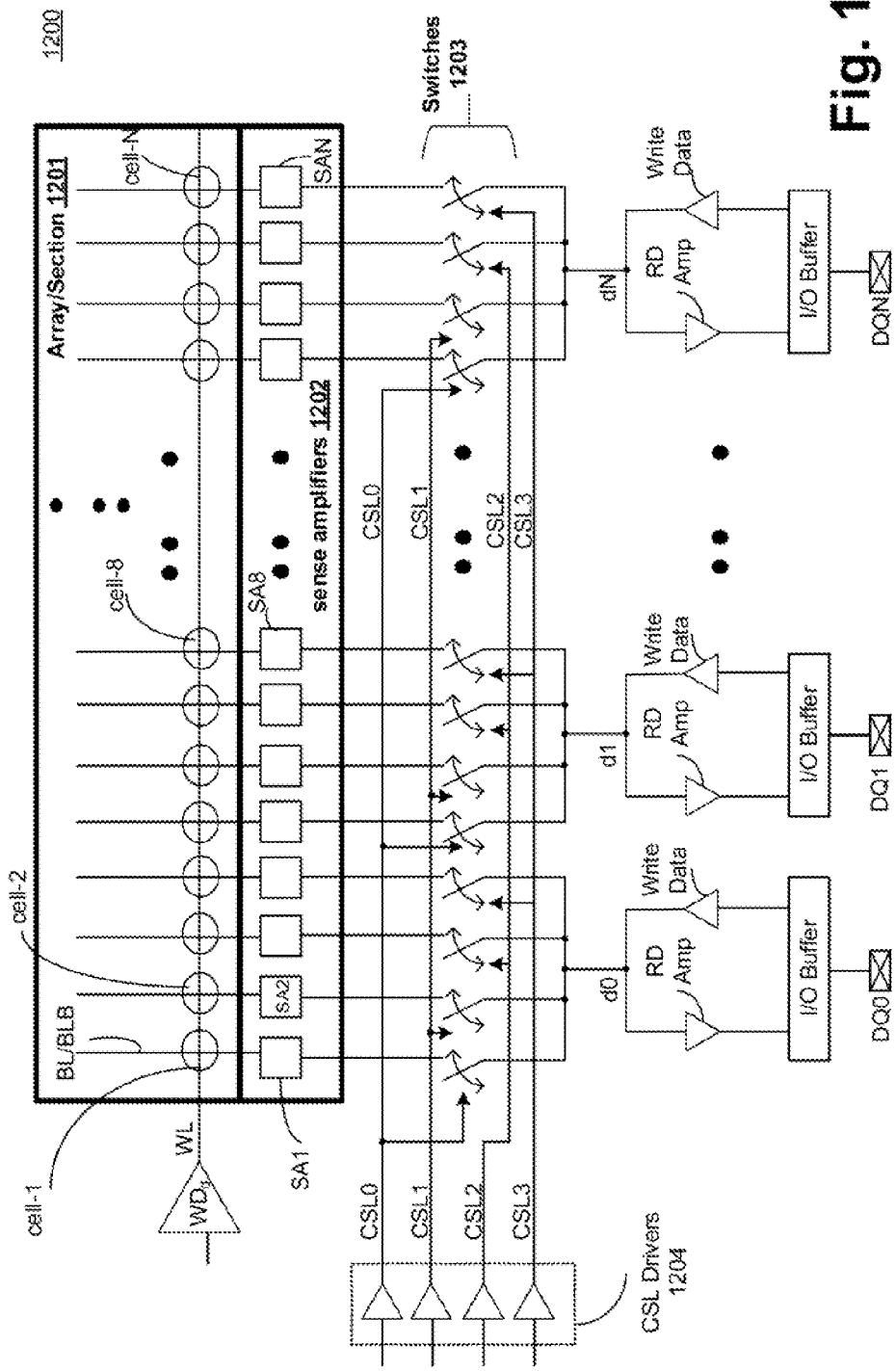
FIG. 12 illustrates an architecture for resetting or presetting a page (i.e., rows of cells) in a section of the memory, according to some embodiments of the disclosure.

FIG. 12 illustrates architecture 1200 for resetting or presetting a page (i.e., rows of cells) in a section of a bank of memory, according to some embodiments of the disclosure. It is pointed out that those elements of FIG. 12 having the same reference numbers (or names) as the elements of any other figure can operate or function in any manner similar to that described, but are not limited to such.

Instead of impacting the subarray architecture and layouts, some embodiments use the existing write command to clear/set a whole row by activating multiple CSL. In some embodiments, architecture 1200 comprises Array/Section 1201 with associated sense amplifiers 1202, switches 1203, CSL Driver 1204, and a plurality of RD Amps and Write Drivers coupled to respective I/O Buffers and data pins (DQ pins). In this example, 'N' data pins are shown.

In some case, before starting operation of the memory, it may be desired to reset or preset the contents of the memory without driving data on the data pins. In some embodiments, multiple CSL Drivers 1204 are enabled by a preset/reset command sent by Processor 101 at the same time. In some embodiments, CSL Drivers 1204 turn on Switches 1203 (e.g., by CSL lines CSL0/1/2/3) when a preset/reset command is received so that the output of sense amplifier 1202 are coupled to the outputs of the Write Drivers. In some embodiments, by turning on all Switches 1203, simultaneous write operations to a row of memory cells is possible. In some embodiments, when all the CSLs in a page are selected and activated, all the pre-decoded column address signals are activated.

In some embodiments, when the preset/reset command is received from Processor 101, the Write Drivers increase their driving strength relative to their normal driving strength. One reason for increasing the driving strength is to ensure that the data latched in the SAs is overridden by the Write Drivers. In some embodiments, after the preset/reset command is received, the SAs are made weaker than normal using the embodiments described with reference to FIGS. 5-6.

Referring back to FIG. 12, in some embodiments, the initializing value desired for the row of memory cells is provided by the data pins DQ0-DQN, where 'N' is an integer greater than 1. In some embodiments, when a reset command is issued by Processor 101, the Write Drivers drive a logic low on nodes d0-dN to override the values stored in SA1-SAN with logic lows. In some embodiments, these values in the SAs are written to the selected row of memory cells (i.e., those selected by the activated WL driven by WL driver $WD_d$). In some embodiments, when a preset command is issued by Processor 101, the Write Drivers drive a logic high on nodes d0-dN to override the values stored in SA1-SAN with logic highs. In some embodiments, these values in the SAs are written to the selected row of memory cells (i.e., those selected by the activated WL driven by WL driver $WD_d$).

FIGS. 13A-B illustrate plots 1300 and 1320 showing timing diagrams for resetting or presetting a page (i.e., rows of cells) in a section of the memory, according to some embodiments of the disclosure. It is pointed out that those elements of FIGS. 13A-B having the same reference numbers (or names) as the elements of any other figure can operate or function in any manner similar to that described, but are not limited to such.

Here, x-axis is time and y-axis is voltage. Initially, before the BL and BLB nodes are sensed, voltages on those nodes are equalized. After equalization, the WL is activated as indicated by the dotted gray line. Upon activating the WL, the BL and BLB signals begin to drift apart according to the charge stored in the memory cell (which is selected by the WL). The charge stored by the memory cell is latched by the SA, which senses the BL and BLB. In this example, the BL is charges to Vcc and the BLB charges to Vss.

In some embodiments, when Memory 102 receives a reset signal from Processor 101, Write Driver(s) drive a logic low on the GIO lines. This logic low is strong enough to override the sensed value latched by the SA. The CLS lines cause the Switches 1203 to turn on, allowing the Write Driver(s) to drive data on to the SAs. As such, the charges stored on the BL node switches to logic low (and the charge stored on the BLB node switches to logic high) as indicated by plot 1300. These charges on the BL and BLB nodes are then stored in the selected memory cells which causes the selected memory cells to be reset. In some embodiments, the CSL on-time (i.e., the duration the CSL Drivers 1204 are driving to turn on Switches 1203) is longer than the normal write times to ensure that the data stored in the memory cells are reset.

In some embodiments, when Memory 102 receives a preset signal from Processor 101, the Write Driver(s) drive a logic high on the GIO lines. This logic high is strong enough to override the sensed value latched the SA. The CLS lines cause the Switches 1203 to turn on, allowing the Write Driver(s) to drive data on to the SAs. As such, the charges stored on the BL node switches to logic high (and the charge stored on the BLB node switches to logic low). These charges on the BL and the BLB nodes are then stored in the selected memory cells which causes the selected memory cells to be preset. In some embodiments, the CSL on-time (i.e., the duration the CSL Drivers 1204 are driving to turn on Switches 1203) is longer than the normal write times to ensure that the data stored in the memory cells is preset.

Plot 1320 is a variation of plot 1300 in that the write operation begins as soon as the voltages on BL and BLB nodes begin to drift apart. In some embodiments, the CSL activation timing is the same as the WL activation timing. For example, the CSL Drivers turn on Switches 1203 at substantially the same time the $WD_d$ activates the $WL_s$. In some embodiments, CSL Drivers turn on Switches 1203 before $WL_s$ are activated but after equalization process is off.

Figure 14:
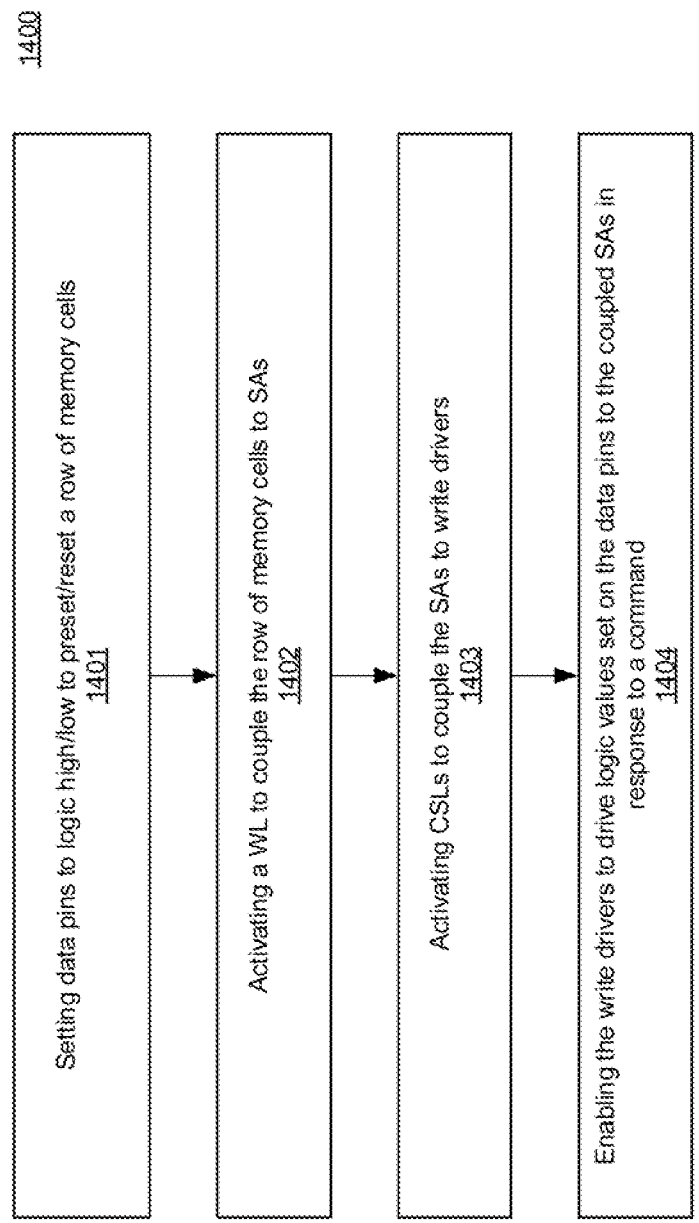
FIG. 14 illustrates a flowchart of a method for resetting or presetting a page (i.e., rows of memory cells) in a section of the memory, according to some embodiments of the disclosure.

FIG. 14 illustrates flowchart 1400 of a method for resetting or presetting a page (i.e., rows of cells) in a section of the memory, according to some embodiments of the disclosure. It is pointed out that those elements of FIG. 14 having the same reference numbers (or names) as the elements of any other figure can operate or function in any manner similar to that described, but are not limited to such.

Although the blocks in the flowchart with reference to FIG. 14 are shown in a particular order, the order of the actions can be modified. Thus, the illustrated embodiments can be performed in a different order, and some actions/blocks may be performed in parallel. Some of the blocks and/or operations listed in FIG. 14 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 1401, data pins (i.e., DQ pins) are set to logic high or logic low to preset or reset a row of memory cells. In some embodiments, a reset or preset command from Processor 101 causes the Write Drivers to drive a logic low or a logic high on the GIO lines. In one such embodiment, the data pins are not set to logic high or logic low so that the entire process of resetting/presetting is handled within Memory 102.

At block 1402, the WL is activated which couples the row of memory cells to the SAs. In some embodiments, for resetting/presetting operation, the SAs are weakened relative to their normal strengths. At block 1403, CSL drivers 1204 drive Switches 1202 to couple the SAs to the Write Drivers. At block 1404, the Write Drivers are enabled by the reset/preset command to drive logic values set on the data pins to the coupled SAs.

In some embodiments, depending on the reset/preset command, the Write Drivers drive a logic low or logic high on the GIO lines instead of the values applied to the data pins. As such, the memory can be reset or preset without data transfer on the data pins. In some embodiments, the Write Drivers are made stronger upon receiving the reset/preset command from Processor 101. One reason for making the Write Driver stronger is to override the values stored in the SAs.

Figure 15:
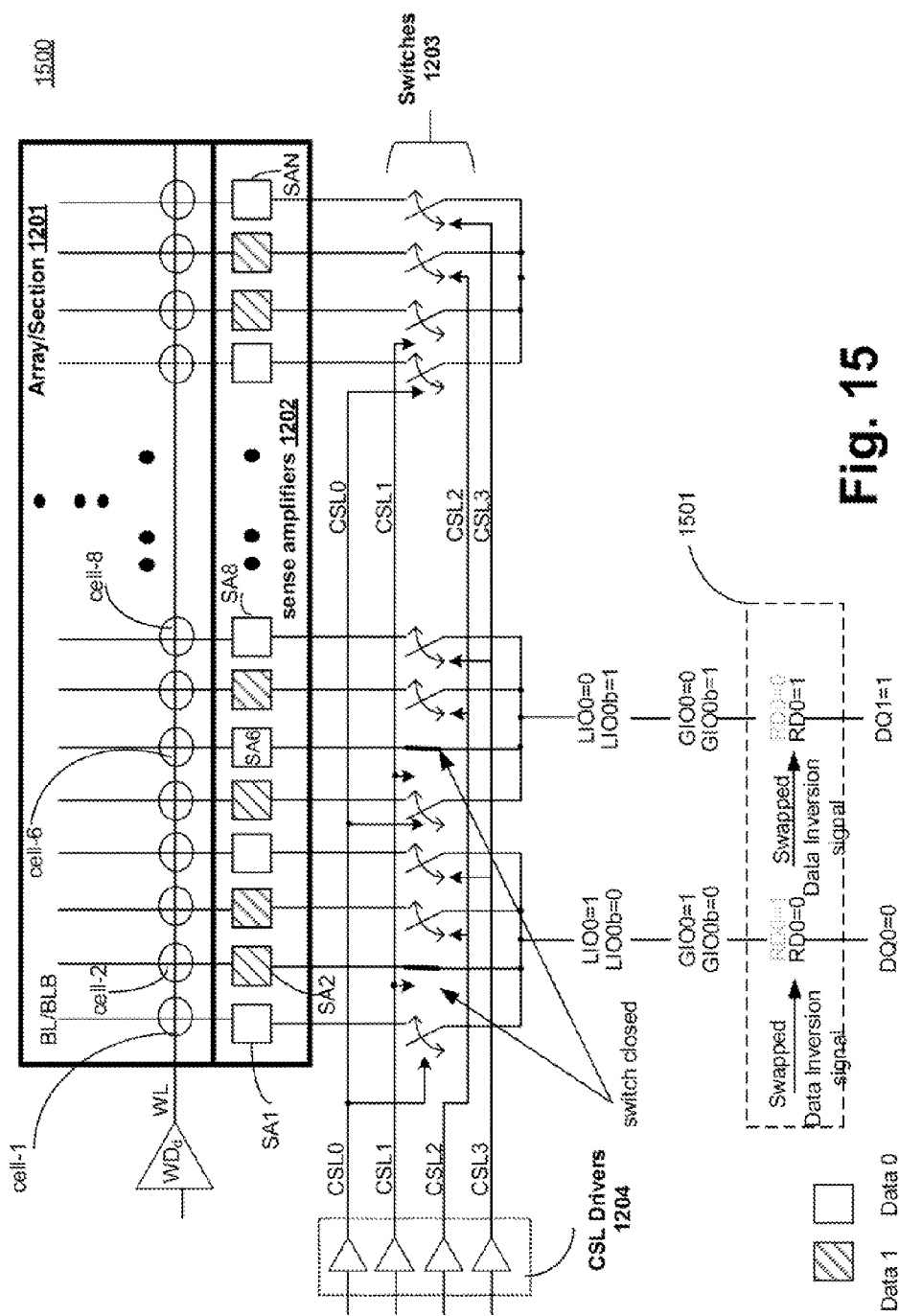
FIG. 15 illustrates an architecture for inverting data from the page (i.e., rows of memory cells) in a section of the memory, according to some embodiments of the disclosure.

FIG. 15 illustrates architecture 1500 for inverting data from the page (i.e., rows of cells) in a section of the memory, according to some embodiments of the disclosure. It is pointed out that those elements of FIG. 15 having the same reference numbers (or names) as the elements of any other figure can operate or function in any manner similar to that described, but are not limited to such.

Some embodiments allow users to specify a range of the memory to be complemented and allows the memory to do that by itself once a command is given. In some embodiments, a data inversion mechanism is provided to swap and output Data_Bar or Data_True before the output buffers.

In some embodiments, the WL is activated by the $WD_d$ to select a particular row of memory cells in Array/Section 1201. Depending on which bit-cell value to invert, the SA associated with that bit-cell is coupled to the local IO (LIO) line via the appropriate CSL Driver. For example, SA2 is coupled to the LIO line when CSL Driver 1204 drives CSL1 to close that Switch while other Switches 1203 are kept open by other CSL Drivers. In some embodiments, the value stored in the LIO line, which is then coupled on to the GIO line, is swapped or inverted by RD Amp 1501 in response to a data inversion command.

In this example, SA2 senses a logic high from memory cell-2. This sensed output is then swapped to logic low by the data inversion circuit 1501 (which in some embodiments is part of the RD Amp) controllable by the data inversion signal. Continuing with the example illustrated in FIG. 15, SA6 senses a logic low from memory cell-6. This sensed output is then swapped to logic high by the data inversion circuit 1501 controllable by the data inversion signal. In some embodiments, the inversion circuit is implemented as a NAND gate at the output of the RD Amp, where the NAND gate receives one input from the SA output, and the other input indicating enablement of the inversion process.

Figure 16:
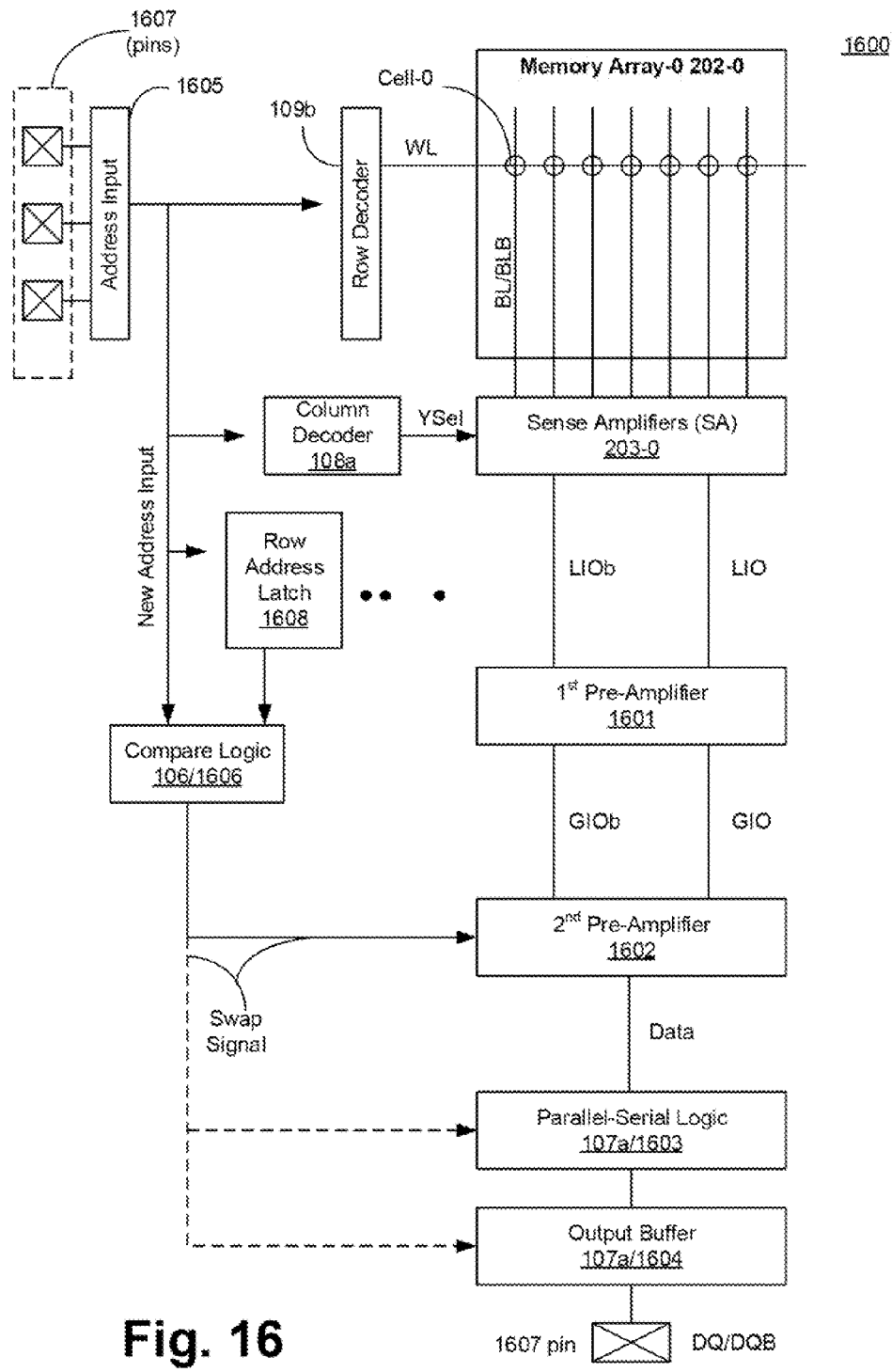
FIG. 16 illustrates a high-level architecture for inverting data from the page (i.e., rows of memory cells) in a section of the memory, according to some embodiments of the disclosure.

FIG. 16 illustrates a high-level architecture 1600 for inverting data from the page (i.e., rows of cells) in a section of the memory, according to some embodiments of the disclosure. It is pointed out that those elements of FIG. 16 having the same reference numbers (or names) as the elements of any other figure can operate or function in any manner similar to that described, but are not limited to such.

In some embodiments, this swapping operation is performed using the exiting memory internal IO bus architecture and an additional Row Address Compare circuit. In some embodiments, when the Row Address Compare circuits detect a match between an input address and a registered address (which is the address of a row of memory cells whose data is desired to be swapped), Processor 101 sends a swap enable signal to pre-latch circuits, positioned before the output buffers, to swap/invert the data. In some embodiments, the inverted data is output from the memory chip 102.

In some embodiments, architecture 1600 comprises Memory Array-0 2-202-0, Row Decoder 109b, Sense Amplifiers 203-0, Column Decoder 108a, first ($1^{st}$) Pre-Amplifier 1601, second ($2^{nd}$) Pre-Amplifier 1602 (e.g., RD Amp), Parallel-Serial Logic 107a/1603, Output Buffer 107a/1604, Address Input buffers 1605, Compare Logic 106/1606, pins 1607, Row Address Latch 1608, and Row Address Input coupled together as shown.

In some embodiments, Swap Signal (same as data inversion signal) is received by $2^{nd}$ Pre-Amplifier 1602, Parallel-Serial Logic 107a/1603, and/or Output Buffer 107a/1604. In such embodiments, data read from the SA 203-0 and provided on LIO/LIOb, GIO/GIOb, and/or Data lines, is inverted at the outputs of $2^{nd}$ Pre-Amplifier 1602, Parallel-Serial Logic 107a/1603, and/or Output Buffer 107a/1604.

In some embodiments, MSR 104 sets dinv 104d register to indicate that the output of the SA for a particular row should be inverted. In some embodiments, this particular row is selected by Address Input 1605 provided at pins 1607 to Row Decoder 109b. In some embodiments, the specified row address is latched by Row Address Latch 1608 and Compare Logic 1606. In some embodiments, Compare Logic 1606 comprises Exclusive-OR (XOR) gates. In some embodiments, Compare Logic 1606 compares the new input address with that stored in the Row Address Latch 1608.

In some embodiments, if Compare Logic 1606 determines that the New Address input is different from the row address (which is a preset or predetermined address for the row whose data is to be inverted), then normal read operation is performed. In normal read operation, outputs from $2^{nd}$ Pre-Amplifier 1602, Parallel-Serial Logic 107a/1603, and/or Output Buffer 107a/1604 are not inverted in response to the Swap Signal.

In some embodiments, if Compare Logic 1606 determines that the New Address input is the same as the row address (which is a preset or predetermined address for the row whose data is to be inverted), then data inversion is performed. In this mode, outputs from $2^{nd}$ Pre-Amplifier 1602, Parallel-Serial Logic 107a/1603, and/or Output Buffer 107a/1604 are inverted in response to the Swap Signal. In some embodiments, only one of the output from $2^{nd}$ Pre-Amplifier 1602, Parallel-Serial Logic 107a/1603, and/or Output Buffer 107a/1604 is inverted in response to the Swap Signal. While the embodiments of FIGS. 16-17 are illustrated with reference to data inversion, other complex logic functions can also be performed instead of data inversion.

Figure 17:
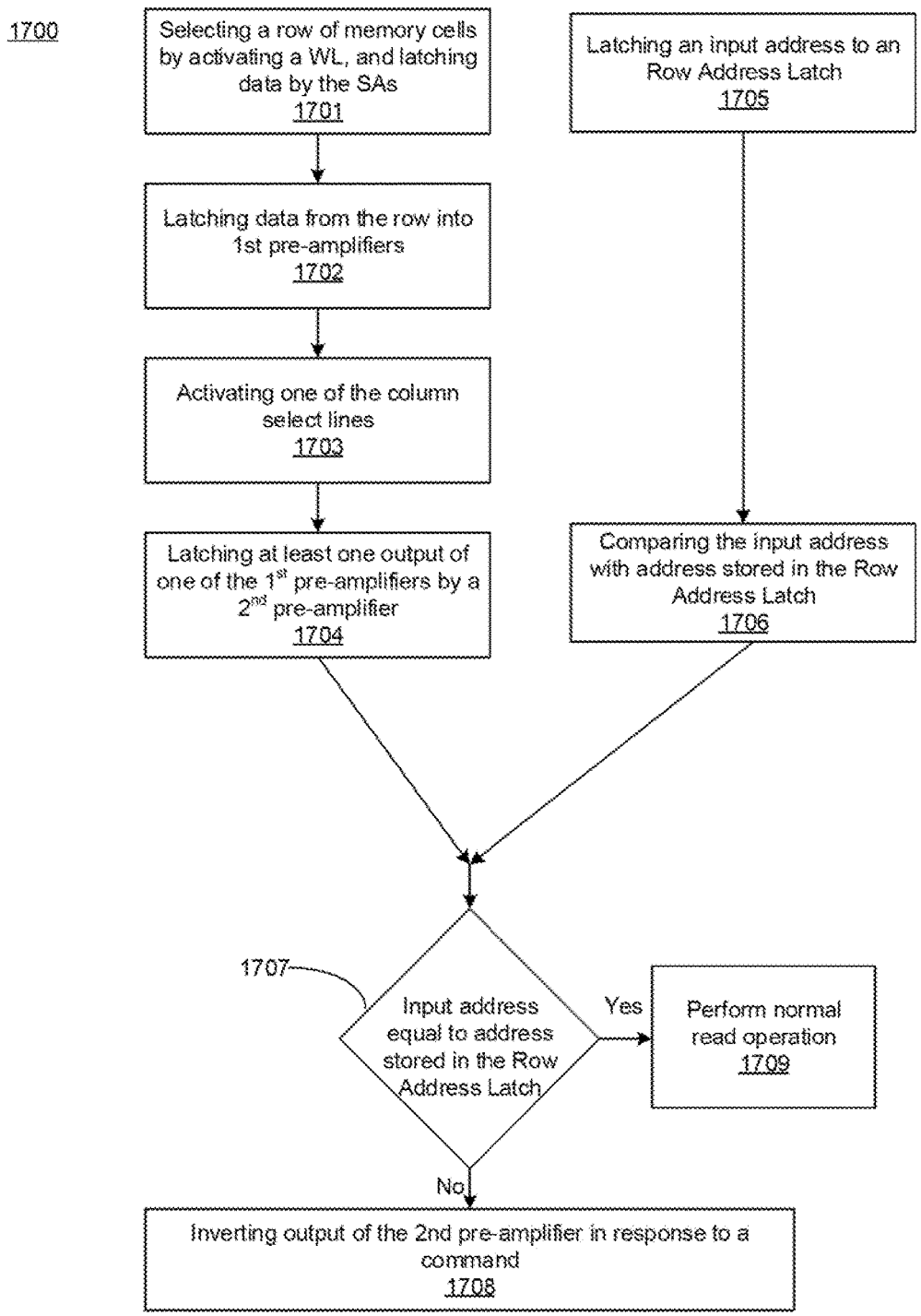
FIG. 17 illustrates a flowchart of a method for inverting data from the page (i.e., rows of memory cells) in a section of the memory, according to some embodiments of the disclosure.

FIG. 17 illustrates flowchart 1700 of a method for inverting data from the page (i.e., rows of cells) in a section of the memory, according to some embodiments of the disclosure. It is pointed out that those elements of FIG. 17 having the same reference numbers (or names) as the elements of any other figure can operate or function in any manner similar to that described, but are not limited to such.

Although the blocks in the flowchart with reference to FIG. 17 are shown in a particular order, the order of the actions can be modified. Thus, the illustrated embodiments can be performed in a different order, and some actions/blocks may be performed in parallel. Some of the blocks and/or operations listed in FIG. 17 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 1701, a row of memory cells whose data is to be inverted is selected by activating a particular WL. In some embodiments, this WL is selected by Address Input 1605 provided at pins 1607 to Row Decoder 109b. Data from the selected row of cells is latched by SAs 203-0. At block 1702, data latched by SAs 203-0 is then latched by $1^{st}$ pre-amplifiers 1601.

At block 1703, one of the CSL is activated. At block 1704, output of $1^{st}$ Pre-amplifiers 1601 is received by $2^{nd}$ Pre-amplifier 1602. The output is latched by $2^{nd}$ Pre-amplifier 1602. At block 1705, the input address is latched by Row Address Latch 1608. At block 1706, Compare Logic 1606 compares the input address to an address in the Row Address Latch 1608. In some embodiments, blocks 1701 through 1704 and blocks 1705 to 1706 are performed in parallel. At block 1707, a determination is made whether the new address input is equal to the address stored in the Row Address Latch 1608. If it is determined that the addresses are the same, then the processor proceeds to block 1709 or else the process proceeds to block 1708. At block 1709, regular read operation is performed. At block 1708, output of the $2^{nd}$ Pre-amplifier 1602 is inverted in response to the Swap Signal.

Figure 18:
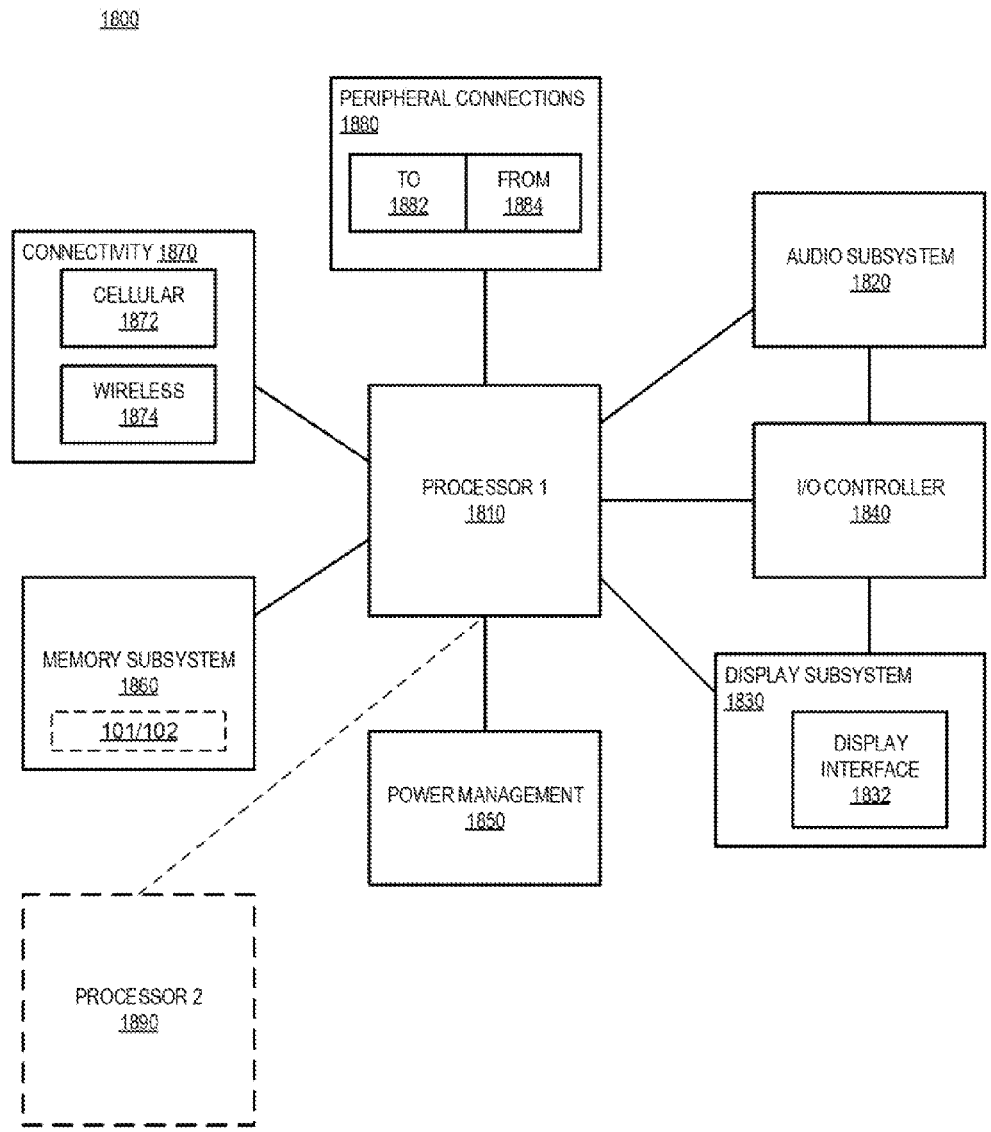
FIG. 18 illustrates a smart device or a computer system or a SoC (System-on-Chip) with an apparatus for page copying within different sections of a memory, for resetting the memory, for pre-setting the memory, and/or for inverting data from the memory, according to some embodiments.

FIG. 18 illustrates a smart device or a computer system or a SoC (System-on-Chip) with an apparatus for page copying within different sections of a memory, for resetting the memory, for pre-setting the memory, and/or for inverting data from the memory, according to some embodiments. It is pointed out that those elements of FIG. 18 having the same reference numbers (or names) as the elements of any other figure can operate or function in any manner similar to that described, but are not limited to such.

FIG. 18 illustrates a block diagram of an embodiment of a mobile device in which flat surface interface connectors could be used. In some embodiments, computing device 1800 represents a mobile computing device, such as a computing tablet, a mobile phone or smart-phone, a wireless-enabled e-reader, or other wireless mobile device. It will be understood that certain components are shown generally, and not all components of such a device are shown in computing device 1800.

In some embodiments, computing device 1800 includes a first processor 1810 (e.g., 101) with an apparatus for page copying within different sections of a memory bank, for resetting the memory, for pre-setting the memory, and/or for inverting data from the memory, according to some embodiments discussed. Other blocks of the computing device 1800 may also include apparatus for page copying within different sections of a memory, for resetting the memory, for pre-setting the memory, and/or for inverting data from the memory, according to some embodiments. The various embodiments of the present disclosure may also comprise a network interface within 1870 such as a wireless interface so that a system embodiment may be incorporated into a wireless device, for example, cell phone or personal digital assistant.

In some embodiments, processor 1810 (and/or processor 1890) can include one or more physical devices, such as microprocessors, application processors, microcontrollers, programmable logic devices, or other processing means. The processing operations performed by processor 1810 include the execution of an operating platform or operating system on which applications and/or device functions are executed. The processing operations include operations related to I/O (input/output) with a human user or with other devices, operations related to power management, and/or operations related to connecting the computing device 1800 to another device. The processing operations may also include operations related to audio I/O and/or display I/O.

In some embodiments, computing device 1800 includes audio subsystem 1820, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1800, or connected to the computing device 1800. In one embodiment, a user interacts with the computing device 1800 by providing audio commands that are received and processed by processor 1810.

In some embodiments, computing device 1800 includes Display subsystem 1830. Display subsystem 1830 represents hardware (e.g., display devices) and software (e.g., drivers) components that provide a visual and/or tactile display for a user to interact with the computing device 1800. Display subsystem 1830 includes display interface 1832, which includes the particular screen or hardware device used to provide a display to a user. In one embodiment, display interface 1832 includes logic separate from processor 1810 to perform at least some processing related to the display. In one embodiment, display subsystem 1830 includes a touch screen (or touch pad) device that provides both output and input to a user.

In some embodiments, computing device 1800 includes I/O controller 1840. I/O controller 1840 represents hardware devices and software components related to interaction with a user. I/O controller 1840 is operable to manage hardware that is part of audio subsystem 1820 and/or display subsystem 1830. Additionally, I/O controller 1840 illustrates a connection point for additional devices that connect to computing device 1800 through which a user might interact with the system. For example, devices that can be attached to the computing device 1800 might include microphone devices, speaker or stereo systems, video systems or other display devices, keyboard or keypad devices, or other I/O devices for use with specific applications such as card readers or other devices.

As mentioned above, I/O controller 1840 can interact with audio subsystem 1820 and/or display subsystem 1830. For example, input through a microphone or other audio device can provide input or commands for one or more applications or functions of the computing device 1800. Additionally, audio output can be provided instead of, or in addition to display output. In another example, if display subsystem 1830 includes a touch screen, the display device also acts as an input device, which can be at least partially managed by I/O controller 1840. There can also be additional buttons or switches on the computing device 1800 to provide I/O functions managed by I/O controller 1840.

In some embodiments, I/O controller 1840 manages devices such as accelerometers, cameras, light sensors or other environmental sensors, or other hardware that can be included in the computing device 1800. The input can be part of direct user interaction, as well as providing environmental input to the system to influence its operations (such as filtering for noise, adjusting displays for brightness detection, applying a flash for a camera, or other features).

In some embodiments, computing device 1800 includes power management 1850 that manages battery power usage, charging of the battery, and features related to power saving operation. Memory subsystem 1860 includes memory devices for storing information in computing device 1800. In some embodiments, Memory subsystem 1800 with an apparatus for page copying within different sections of a memory, for resetting the memory, for pre-setting the memory, and/or for inverting data from the memory, according to some embodiments. In some embodiments, Memory subsystem 1800 a DRAM with apparatus for page copying within different sections of a memory, for resetting the memory, for pre-setting the memory, and/or for inverting data from the memory.

Memory can include nonvolatile (state does not change if power to the memory device is interrupted) and/or volatile (state is indeterminate if power to the memory device is interrupted) memory devices. Memory subsystem 1860 can store application data, user data, music, photos, documents, or other data, as well as system data (whether long-term or temporary) related to the execution of the applications and functions of the computing device 1800.

Elements of embodiments are also provided as a machine-readable medium (e.g., memory 1860) for storing the computer-executable instructions (e.g., instructions to implement any other processes discussed herein). The machine-readable medium (e.g., memory 1860) may include, but is not limited to, flash memory, optical disks, CD-ROMs, DVD ROMs, RAMs, EPROMs, EEPROMs, magnetic or optical cards, PCM, or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1800 comprises connectivity 1870. Connectivity 1870 includes hardware devices (e.g., wireless and/or wired connectors and communication hardware) and software components (e.g., drivers, protocol stacks) to enable the computing device 1800 to communicate with external devices. The computing device 1800 could be separate devices, such as other computing devices, wireless access points or base stations, as well as peripherals such as headsets, printers, or other devices.

Connectivity 1870 can include multiple different types of connectivity. To generalize, the computing device 1800 is illustrated with cellular connectivity 1872 and wireless connectivity 1874. Cellular connectivity 1872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1874 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1800 comprises peripheral connections 1880. Peripheral connections 1880 include hardware interfaces and connectors, as well as software components (e.g., drivers, protocol stacks) to make peripheral connections. It will be understood that the computing device 1800 could both be a peripheral device ("to" 1882) to other computing devices, as well as have peripheral devices ("from" 1884) connected to it. The computing device 1800 commonly has a "docking" connector to connect to other computing devices for purposes such as managing (e.g., downloading and/or uploading, changing, synchronizing) content on computing device 1800. Additionally, a docking connector can allow computing device 1800 to connect to certain peripherals that allow the computing device 1800 to control content output, for example, to audiovisual or other systems.

In addition to a proprietary docking connector or other proprietary connection hardware, the computing device 1800 can make peripheral connections 1880 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a source array of memory cells with associated source sense amplifiers; a destination array of memory cells with associated destination sense amplifiers; and logic to activate a source WL to select a row of memory cells within the source array such that data in the selected row of memory cells is latched by the associated source sense amplifiers, wherein the logic to activate a destination WL to select a row of memory cells within the destination array such that data in the selected row of memory cells is latched by the associated destination sense amplifiers, and wherein the source and destination arrays of memory cells are within a same bank of a memory.

In some embodiments, the apparatus comprises one or more switches to couple output read from the source sense amplifiers to the destination sense amplifiers. In some embodiments, the apparatus comprises: a read amplifier to receive output from at least one source sense amplifier; and a write driver to write data to at least one destination sense amplifier, wherein at least one switch of the one or more switches is coupled to an output of the read amplifier and to an input of the write driver. In some embodiments, the one or more switches are controllable by a page copy command issued by a processor. In some embodiments, the processor comprises a MSR having an entry for the page copy command. In some embodiments, the processor is operable to enable the write driver after the read amplifier latches the output from the at least one source sense amplifier.

In some embodiments, the processor is operable to disable the read amplifier prior to enabling the write driver. In some embodiments, the processor is operable to adjust strength of the at least one source sense amplifier relative to the strength of the at least one destination sense amplifier. In some embodiments, the at least one source sense amplifier has n-type pull-up devices and p-type pull-down devices. In some embodiments, the at least one source sense amplifier has adjustable strength p-type pull-up and n-type pull-down devices.

In another example, a method is provided which comprises: selecting a row of memory cells, within a source array, by activating a source WL; latching data from the selected row of memory cells into source sense amplifiers associated with the source array; enabling read amplifiers to latch output of the source sense amplifiers; and turning on one or more switches to couple output of the read amplifiers to input of write drivers. In some embodiments, the method comprises disabling the read amplifiers after the read amplifiers have latched the output of the source sense amplifiers.

In some embodiments, the method comprises enabling the write drivers to drive the latched output from the read amplifiers to destination sense amplifiers associated with a destination array. In some embodiments, the method comprises latching data by the destination sense amplifiers, the latched data being the latched output from the read amplifiers. In some embodiments, the method comprises selecting a row of memory cells, within the destination array, by activating a destination WL to copy the latched data from the destination sense amplifiers to the selected row of memory cells in the destination array. In some embodiments, the method comprises weakening strength of the source sense amplifiers relative to the destination sense amplifiers prior to latching data by the destination sense amplifiers.

In another example, a system is provided which comprises: a processor having a memory controller; and a DRAM coupled the processor, the DRAM having banks of memories, wherein at least one bank includes: a source array of memory cells with associated source sense amplifiers; and a destination array of memory cells with associated destination sense amplifiers, wherein the memory controller of the processor has logic to activate a source WL to select a row of memory cells within the source array such that data in the selected row of memory cells is latched by the associated source sense amplifiers, wherein the logic is operable to activate a destination WL to select a row of memory cells within the destination array such that data in the selected row of memory cells is latched by the associated destination sense amplifiers; and a wireless interface for allowing the processor to communicate with another device. In some embodiments, the DRAM includes an apparatus according to the apparatus described above. In some embodiments, the wireless interface includes an antenna.

In another example, a method is provided which comprises: setting data pins to logic high or logic low to preset or reset a row of memory cells in an array of a bank of memory; activating a WL to couple the row of memory cells to sense amplifiers associated with the array; activating column select lines to couple the sense amplifiers to write drivers; and enabling the write drivers to drive logic values set on the data pins to the coupled sense amplifiers in response to a command. In some embodiments, enabling the write drivers to drive logic values comprises increasing drive strength of the write drivers. In some embodiments, activating the column select lines is performed before activating the WL and after equalization is turned off.

In some embodiments, activating the column select lines is performed at substantially the same time as activating the WL. In some embodiments, the command is a page reset or page preset command set by an entry in a Mode Select Register of a processor. In some embodiments, enabling the write drivers comprises driving the write drivers for a duration longer than a duration of normal write operations.

In another example, an apparatus is provided which comprises: a row of memory cells in an array of a bank of memory; data pins to receive logic high or logic low to preset or reset the row of memory cells; a word-line driver which is operable to couple the row of memory cells to sense amplifiers associated with the array; column select lines to couple the sense amplifiers to write drivers; and write drivers operable to drive logic values set on the data pins to the coupled sense amplifiers in response to a command.

In some embodiments, the write drivers are operable to increase drive strength of the write drivers. In some embodiments, logic to activate the column select lines before activating the WL. In some embodiments, logic to activate the column select lines at substantially the same time as activating the WL. In some embodiments, the command is a page reset command or a page preset command set by an entry in a Mode Select Register of a processor. In some embodiments, the processor is operable to drive the write drivers for a duration longer than a duration of normal write operations.

In another example, an apparatus is provided which comprises: means for setting data pins to logic high or logic low to preset or reset a row of memory cells in an array of a bank of memory; means for activating a WL to couple the row of memory cells to sense amplifiers associated with the array; means for activating column select lines to couple the sense amplifiers to write drivers; and means for enabling the write drivers to drive logic values set on the data pins to the coupled sense amplifiers in response to a command.

In another example, an apparatus is provided which comprises: the means for enabling the write drivers to drive logic values comprises means for increasing drive strength of the write drivers. In some embodiments, the apparatus comprises the means for activating the column select lines activates the column select lines before activating the WL and after equalization is turned off. In some embodiments, the means for activating the column select lines activates the column select lines at substantially the same time as activating the WL. In some embodiments, the command is a page reset or page preset command set by an entry in a Mode Select Register of a processor. In some embodiments, the means for enabling the write drivers comprises means for driving the write drivers for a duration longer than a duration of normal write operations.

In another example, a method is provided which comprises: selecting a row of memory cells, in an array of a bank of memory, by activating a WL; latching data from the row of memory cells in first pre-amplifiers associated with the array; latching at least one output of one of the first pre-amplifiers by second pre-amplifiers; and inverting output of the second pre-amplifier in response to a command. In some embodiments, the method comprises activating a column select line to provide the at least one output from one of the first pre-amplifiers to the second pre-amplifiers. In some embodiments, the method comprises latching an input address to a row address latch.

In some embodiments, the method comprises comparing the input address with address stored in the row address latch. In some embodiments, the method comprises determining whether the input address is the same as the address stored in row address latch. In some embodiments, the method comprises performing regular read operation if it is determined that the input address is different than the address stored in row address latch. In some embodiments, the method comprises inverting the output of the second pre-amplifiers in response to the command if it is determined that the input address is same as the address stored in row address latch. In some embodiments, the command is an inversion command set by an entry in a Mode Select Register of a processor.

In another example, an apparatus is provided which comprises: means for selecting a row of memory cells, in an array of a bank of memory, by activating a WL; means for latching data from the row of memory cells in first pre-amplifiers associated with the array; means for latching at least one output of one of the first pre-amplifiers by second pre-amplifiers; and means for inverting output of the second pre-amplifier in response to a command.

In some embodiments, the apparatus comprises means for activating a column select line to provide the at least one output from one of the first pre-amplifiers to the second pre-amplifiers. In some embodiments, the apparatus comprises means for latching an input address to a row address latch. In some embodiments, comprises means for comparing the input address with address stored in the row address latch. In some embodiments, the apparatus comprises means for determining whether the input address is the same as the address stored in row address latch.

In some embodiments, the apparatus comprises means for performing regular read operation to perform such regular read operation if it is determined that the input address is different than the address stored in row address latch. In some embodiments, the apparatus comprises means for inverting the output of the second pre-amplifiers in response to the command if it is determined that the input address is same as the address stored in row address latch. In some embodiments, the command is an inversion command set by an entry in a Mode Select Register of a processor.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a source array of memory cells with associated source sense amplifiers;
a destination array of memory cells with associated destination sense amplifiers; and logic to activate a source word-line (WL) to select a row of memory cells within the source array such that data in the selected row of memory cells within the source array is latched by the associated source sense amplifiers, wherein the logic is to activate a destination WL to select a row of memory cells within the destination array such that data in the selected row of memory cells within the destination array is latched by the associated destination sense amplifiers, and wherein the source and destination arrays of memory cells are within a same bank of a memory;

one or more switches to couple output read from the source sense amplifiers to the destination sense amplifiers; and a read amplifier having an output coupled to an input of a write driver through at least one of the one or more switches, wherein at least one source sense amplifier comprises adjustable strength n-type pull-up and p-type pull-down devices.

2. The apparatus of claim 1, wherein the write driver is to write data to at least one destination sense amplifier.

3. The apparatus of claim 1, wherein the one or more switches are controllable by a page copy command issued by a processor.

4. The apparatus of claim 3, wherein the processor includes a mode select register (MSR) having an entry for the page copy command.

5. The apparatus of claim 3, wherein the processor is operable to enable the write driver after the read amplifier latches the output from the at least one source sense amplifier.

6. The apparatus of claim 3, wherein the processor is operable to disable the read amplifier prior to enabling the write driver.

7. The apparatus of claim 3, wherein the processor is operable to adjust strength of the at least one source sense amplifier relative to the strength of at least one destination sense amplifier.

8. A method comprising
selecting a row of memory cells, within a source array, by activating a source word-line (WL);
latching data from the selected row of memory cells into source sense amplifiers associated with the source array;
enabling read amplifiers to latch output of the source sense amplifiers;
turning on one or more switches to couple output of the read amplifiers to input of write drivers; and
weakening strength of the source sense amplifiers relative to destination sense amplifiers prior to latching data by the destination sense amplifiers, wherein at least one source sense amplifier comprises adjustable strength n-type pull-up and p-type pull-down devices.

9. The method of claim 8 comprises disabling the read amplifiers after the read amplifiers have latched the output of the source sense amplifiers.

10. The method of claim 9 comprises enabling the write drivers to drive the latched output from the read amplifiers to the destination sense amplifiers associated with a destination array.

11. The method of claim 10 comprises latching data by the destination sense amplifiers, the latched data being the latched output from the read amplifiers.

12. The method of claim 11 comprises selecting a row of memory cells, within the destination array, by activating a destination WL to copy the latched data from the destination sense amplifiers to the selected row of memory cells in the destination array.

13. A system comprises:
a processor having a memory controller; and
a dynamic random access memory (DRAM) coupled to the processor, the DRAM having banks of memories, wherein at least one bank includes:
a source array of memory cells with associated source sense amplifiers; and
a destination array of memory cells with associated destination sense amplifiers, wherein the memory controller of the processor has logic to activate a source word-line (WL) to select a row of memory cells within the source array such that data in the selected row of memory cells within the source array is latched by the associated source sense amplifiers,
wherein the logic is operable to activate a destination WL to select a row of memory cells within the destination array such that data in the selected row of memory cells within the destination array is latched by the associated destination sense amplifiers; and
wherein at least one source sense amplifier comprises adjustable strength n-type pull-up and p-type pull-down devices;
one or more switches to couple output read from the source sense amplifiers to the destination sense amplifiers; and
a read amplifier having an output coupled to an input of a write driver through at least one of the one or more switches; and
a wireless interface to allow the processor to communicate with another device.

14. The system of claim 13, wherein the write driver is to write data to at least one destination sense amplifier.

15. The system of claim 13 wherein the wireless interface includes an antenna.

16. The system of claim 13, wherein the memory controller includes:
a mode select register (MSR) having an entry for a page copy command.

17. The apparatus of claim 1 comprises circuitry for weakening strength of the source sense amplifiers relative to the destination sense amplifiers prior to latching data by the destination sense amplifiers.

18. The apparatus of claim 1 comprises logic to disable the read amplifier after the read amplifier latches the output of the source sense amplifiers.

19. The apparatus of claim 1 comprises logic to enable the write driver to drive the latched output latched from the read amplifier to the destination sense amplifiers associated with the destination array.

20. The apparatus of claim 1, wherein the destination sense amplifier is to latch data which is the output from the read amplifier.

* * * * *